(12) United States Patent
Silverbrook

(10) Patent No.: US 6,264,850 B1
(45) Date of Patent: *Jul. 24, 2001

(54) DUAL NOZZLE SINGLE HORIZONTAL FULCRUM ACTUATOR INKJET

(75) Inventor: Kia Silverbrook, Sydney (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

This patent is subject to a terminal disclaimer.

(21) Appl. No.: 09/112,800

(22) Filed: Jul. 10, 1998

(30) Foreign Application Priority Data

Jul. 15, 1997 (AU) .................................................... P07991
Dec. 12, 1997 (AU) .................................................... PP0882

(51) Int. Cl.$^7$ ...................................................... B41J 2/04
(52) U.S. Cl. .................................. 216/27; 438/21; 347/56; 347/60; 347/62
(58) Field of Search ............................ 216/27; 347/56–62; 438/21

(56) References Cited

U.S. PATENT DOCUMENTS 3,747,120 * 7/1973 Stemme ................................ 347/70
4,611,219 * 9/1986 Sugitani et al. ...................... 347/40

* cited by examiner

Primary Examiner—Alexander Markoff
Assistant Examiner—Shamim Ahmed

(57) ABSTRACT

An ink jet printhead includes a nozzle chamber having at least two fluid ejection apertures defined in a roof of the chamber; a moveable paddle vane located in a region of a first one of the fluid ejection apertures; an actuator mechanism attached to the moveable paddle vane and adapted to move the paddle vane in a first direction so as to cause the ejection of fluid drops out of the first fluid ejection aperture and to further move the paddle vane in a second, alternative direction so as to cause the ejection of fluid drops out of a second fluid ejection aperture. A method of manufacture of such a printhead comprises initially providing a silicon wafer having a circuitry wafer layer including electrical circuitry necessary for the operation of the actuator mechanism on demand. A trough is etched in the wafer to provide for an ink supply channel through a portion of the wafer. The nozzle chamber, the actuator mechanism and the paddle vane within the nozzle chamber are created on the silicon wafer by means of depositing and etching a series of sacrificial layers to form a supporting structure for the nozzle chamber, the actuator mechanism and the paddle vane, in addition to depositing and suitably etching a series of materials for forming the nozzle chamber including a pair of fluid ejection apertures in a roof of the nozzle chamber, the actuator mechanism and the paddle vane. An ink inlet is etched in the wafer, the inlet being in communication with the nozzle chamber via the ink supply channel extending through the wafer. Any remaining sacrificial layers are etched away so as to release the actuator mechanism and the paddle vane such that the paddle vane is displaceable relative to the fluid ejection apertures for effecting ink ejection from one of the apertures at a time on demand.

8 Claims, 20 Drawing Sheets

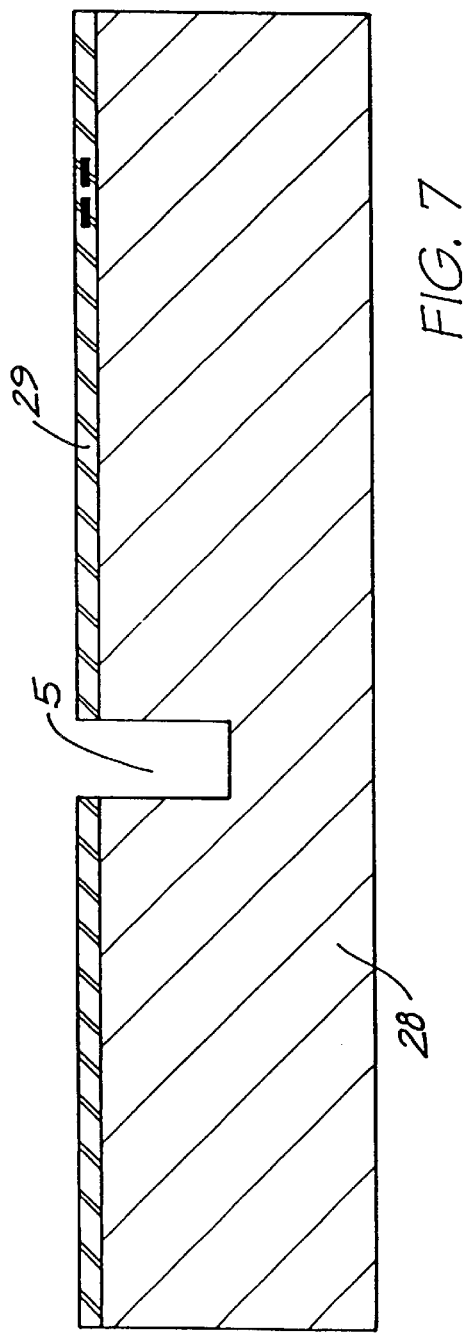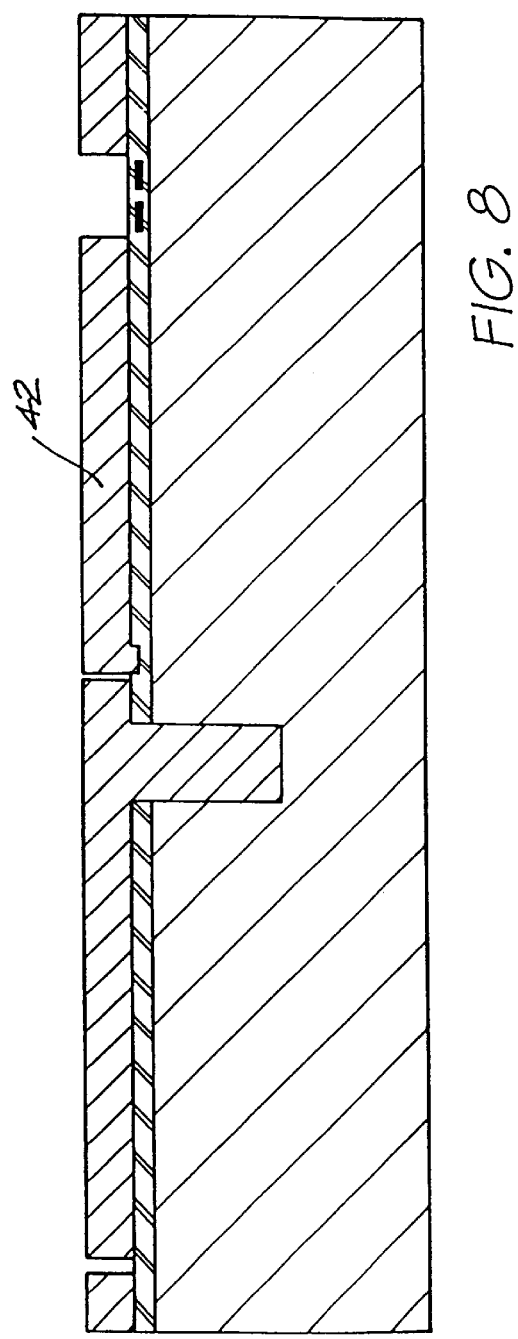

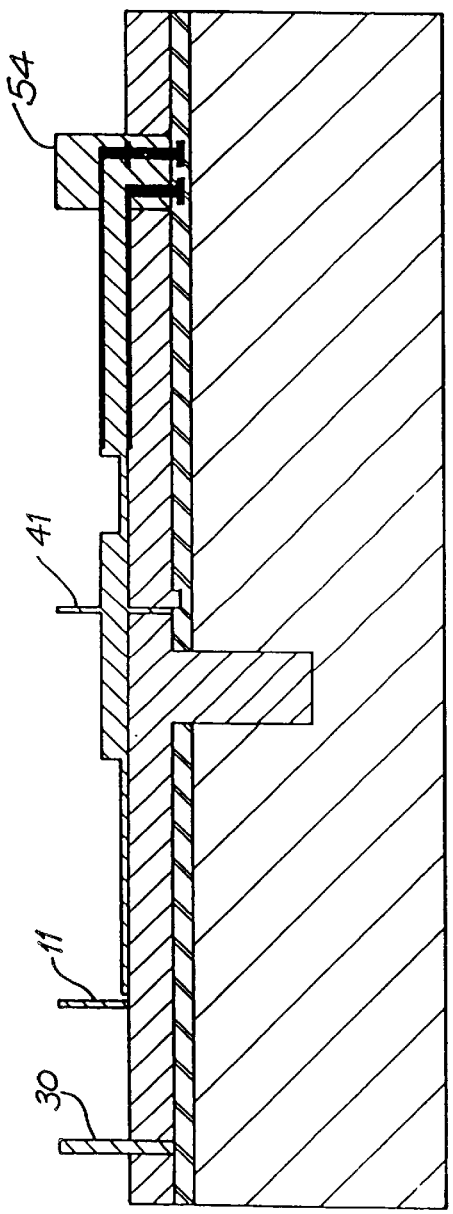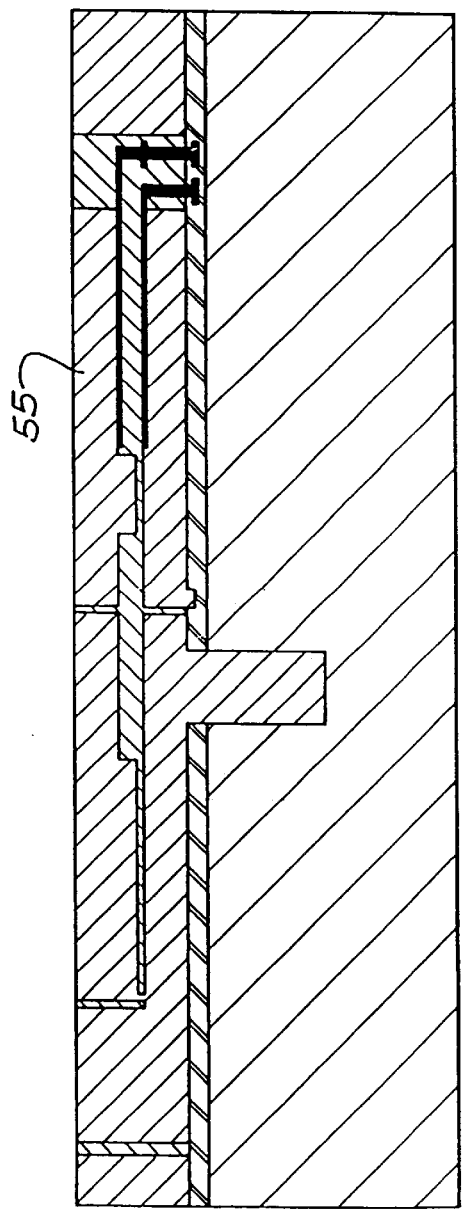

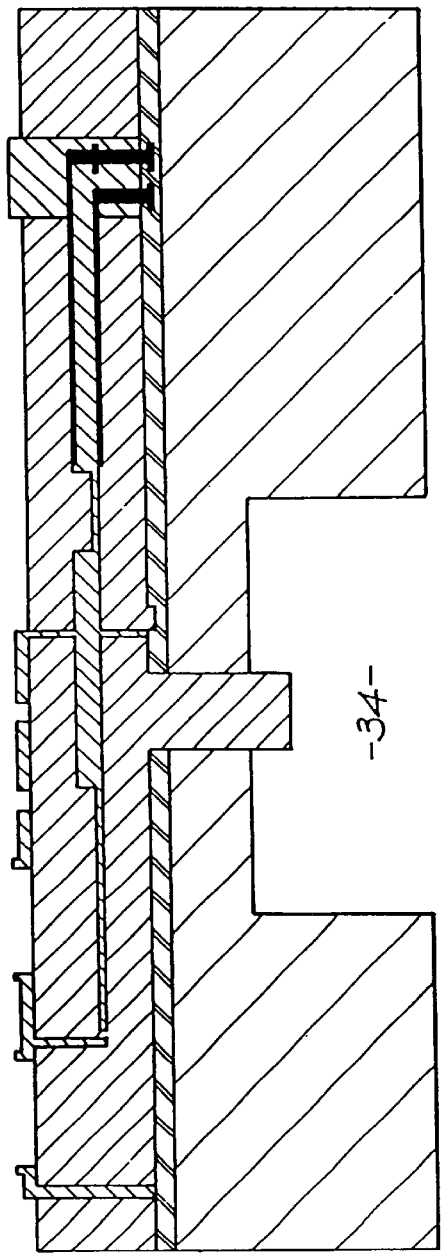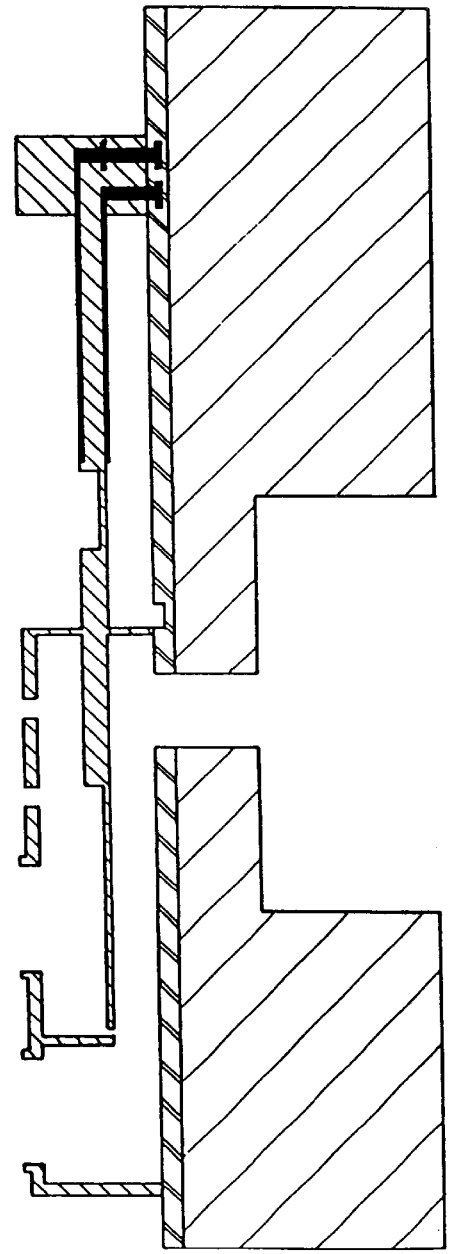

DUAL NOZZLE SINGLE HORIZONTAL FULCRUM ACTUATOR INKJET

CROSS REFERENCES TO RELATED APPLICATIONS

The following Australian provisional patent applications are hereby incorporated by cross-reference. For the purposes of location and identification, US patent applications identified by their US patent application serial numbers (USSN) are listed alongside the Australian applications from which the US patent applications claim the right of priority.

| CROSS-REFERENCED AUSTRALIAN PROVISIONAL PATENT APPLICATION NO. | U.S. PAT. NO./PATENT APPLICATION (CLAIMING RIGHT OF PRIORITY FROM AUSTRALIAN PROVISIONAL APPLICATION) | DOCKET NO. |
|---|---|---|
| PO7991 | 09/113,060 | ART01 |
| PO8505 | 09/113,070 | ART02 |
| PO7988 | 09/113,073 | ART03 |
| PO9395 | 09/112,748 | ART04 |
| PO8017 | 09/112,747 | ART06 |
| PO8014 | 09/112,776 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 09/112,740 | ARTI3 |
| PO7997 | 09/112,739 | ART15 |
| PO7979 | 09/113,053 | ART16 |
| PO8015 | 09/112,738 | ART17 |
| PO7978 | 09/113,067 | ART18 |
| PO7982 | 09/113,063 | ART19 |
| PO7989 | 09/113,069 | ART20 |
| PO8019 | 09/112,744 | ART21 |
| PO7980 | 09/113,058 | ART22 |
| PO8018 | 09/112,777 | ART24 |
| PO7938 | 09/113,224 | ART25 |
| PO8016 | 09/112,804 | ART26 |
| PO8024 | 09/112,805 | ART27 |
| PO7940 | 09/113,072 | ART28 |
| PO7939 | 09/112,785 | ART29 |
| PO8501 | 6,137,500 | ART30 |
| PO8500 | 09/112,796 | ART31 |
| PO7987 | 09/113,071 | ART32 |
| PO8022 | 09/112,824 | ART33 |
| PO8497 | 09/113,090 | ART34 |
| PO8020 | 09/112,823 | ART38 |
| PO8023 | 09/113,222 | ART39 |
| PO8504 | 09/112,786 | ART42 |
| PO8000 | 09/113,051 | ART43 |
| PO7977 | 09/112,782 | ART44 |
| PO7934 | 09/113,056 | ART45 |
| PO7990 | 09/113,059 | ART46 |
| PO8499 | 09/113,091 | ART47 |
| PO8502 | 09/112,753 | ART48 |
| PO7981 | 09/113,055 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758 | ART57 |
| PO9396 | 09/113,107 | ART58 |
| PO9397 | 09/112,829 | ART59 |
| PO9398 | 09/112,792 | ART60 |
| PO9399 | 6,106,147 | ART61 |
| PO9400 | 09/112,790 | ART62 |
| PO9401 | 09/112,789 | ART63 |
| PO9402 | 09/112,788 | ART64 |
| PO9403 | 09/112,795 | ART65 |
| PO9405 | 09/112,749 | ART66 |
| PP0959 | 09/112,784 | ART68 |
| PP1397 | 09/112,783 | ART69 |
| PP2370 | 09/112,781 | DOT01 |
| PP2371 | 09/113,052 | DOT02 |
| PO8003 | 09/112,834 | Fluid01 |
| PO8005 | 09/113,103 | Fluid02 |
| PO9404 | 09/113,101 | Fluid03 |
| PO8066 | 09/112,751 | IJ01 |
| PO8072 | 09/112,787 | IJ02 |
| PO8040 | 09/112,802 | IJ03 |
| PO8071 | 09/112,803 | IJ04 |
| PO8047 | 09/113,097 | IJ05 |
| PO8035 | 09/113,099 | IJ06 |
| PO8044 | 09/113,084 | IJ07 |
| PO8063 | 09/113,066 | IJ08 |
| PO8057 | 09/112,778 | IJ09 |
| PO8056 | 09/112,779 | IJ10 |
| PO8069 | 09/113,077 | IJ11 |
| PO8049 | 09/113,061 | IJ12 |
| PO8036 | 09/112,818 | IJ13 |
| PO8048 | 09/112,816 | IJ14 |
| PO8070 | 09/112,772 | IJ15 |
| PO8067 | 09/112,819 | IJ16 |
| PO8001 | 09/112,815 | IJ17 |
| PO8038 | 09/113,096 | IJ18 |
| PO8033 | 09/113,068 | IJ19 |
| PO8002 | 09/113,095 | IJ20 |
| PO8068 | 09/112,808 | IJ21 |
| PO8062 | 09/112,809 | IJ22 |
| PO8034 | 09/112,780 | IJ23 |
| PO8039 | 09/113,083 | IJ24 |
| PO8041 | 09/113,121 | IJ25 |
| PO8004 | 09/113,122 | IJ26 |
| PO8037 | 09/112,793 | IJ27 |
| PO8043 | 09/112,794 | IJ28 |
| PO8042 | 09/113,128 | IJ29 |
| PO8064 | 09/113,127 | IJ30 |
| PO9389 | 09/112,756 | IJ31 |
| PO9391 | 09/112,755 | IJ32 |
| PP0888 | 09/112,754 | IJ33 |
| PP0891 | 09/112,811 | IJ34 |
| PP0890 | 09/112,812 | IJ35 |
| PP0873 | 09/112,813 | IJ36 |
| PP0993 | 09/112,814 | IJ37 |
| PP0890 | 09/112,764 | IJ38 |
| PP1398 | 09/112,761 | IJ39 |
| PP2592 | 09/112,767 | IJ40 |
| PP2593 | 09/112,768 | IJ41 |
| PP3991 | 09/112,807 | I142 |
| PP3987 | 09/112,806 | IJ43 |
| PP3985 | 09/112,820 | IJ44 |
| PP3983 | 09/112,821 | IJ45 |
| PO7935 | 09/112,822 | IJM01 |
| PO7936 | 09/112,825 | IJM02 |
| PO7937 | 09/112,826 | IJM03 |
| PO8061 | 09/112,827 | IJM04 |
| PO8054 | 09/112,828 | IJM05 |
| PO8065 | 6,071,750 | IJM06 |
| PO8055 | 09/113,108 | IJM07 |
| PO8053 | 09/113,109 | IJM08 |
| PO8078 | 09/113,123 | IJM09 |
| PO7933 | 09/113,114 | IJM10 |
| PO7950 | 09/113,115 | IJM11 |
| PO7949 | 09/113,129 | IJM12 |
| PO8060 | 09/113,124 | IJM13 |
| PO8059 | 09/113,125 | IJM14 |
| PO8073 | 09/113,126 | IJM15 |
| PO8076 | 09/113,119 | IJM16 |
| PO8075 | 09/113,120 | IJM17 |
| PO8079 | 09/113,221 | IJM18 |
| PO8050 | 09/113,116 | IJM19 |
| PO8052 | 09/113,118 | IJM20 |
| PO7948 | 09/113,117 | IJM21 |
| PO7951 | 09/113,113 | IJM22 |
| PO8074 | 09/113,130 | IJM23 |

-continued

| CROSS-REFERENCED AUSTRALIAN PROVISIONAL PATENT APPLICATION NO. | U.S. PAT. NO./PATENT APPLICATION (CLAIMING RIGHT OF PRIORITY FROM AUSTRALIAN PROVISIONAL APPLICATION) | DOCKET NO. |
|---|---|---|
| PO7941 | 09/113,110 | IJM24 |
| PO8077 | 09/113,112 | IJM25 |
| PO8058 | 09/113,087 | IJM26 |
| PO8051 | 09/113,074 | IJM27 |
| PO8045 | 6,110,754 | IJM28 |
| PO7952 | 09/113,088 | IJM29 |
| PO8046 | 09/112,771 | IJM30 |
| PO9390 | 09/112,769 | IJM31 |
| PO9392 | 09/112,770 | IJM32 |
| PP0889 | 09/112,798 | IJM35 |
| PP0887 | 09/112,801 | IJM36 |
| PP0882 | 09/112,800 | IJM37 |
| PP0874 | 09/112,799 | IJM38 |
| PP1396 | 09/113,098 | IJM39 |
| PP3989 | 09/112,833 | IJM40 |
| PP2591 | 09/112,832 | IJM41 |
| PP3990 | 09/112,831 | IJM42 |
| PP3986 | 09/112,830 | IJM43 |
| PP3984 | 09/112,836 | IJM44 |
| PP3982 | 09/112,835 | IJM45 |
| PP0895 | 09/113,102 | IR01 |
| PP0870 | 09/113,106 | IR02 |
| PP0869 | 09/113,105 | IR04 |
| PP0887 | 09/113,104 | IR05 |
| PP0885 | 09/112,810 | IR06 |
| PP0884 | 09/112,766 | IR10 |
| PP0886 | 09/113,085 | IR12 |
| PP0871 | 09/113,086 | IR13 |
| PP0876 | 09/113,094 | IR14 |
| PP0877 | 09/112,760 | IR16 |
| PP0878 | 09/112,773 | IR17 |
| PP0879 | 09/112,774 | IR18 |
| PP0883 | 09/112,775 | IR19 |
| PP0880 | 6,152,619 | IR20 |
| PP0881 | 09/113,092 | IR21 |
| PO8006 | 6,087,638 | MEMS02 |
| PO8007 | 09/113,093 | MEMS03 |
| PO8008 | 09/113,062 | MEMS04 |
| PO8010 | 6,041,600 | MEMS05 |
| PO8011 | 09/113,082 | MEMS06 |
| PO7947 | 6,067,797 | MEMS07 |
| PO7944 | 09/113,080 | MEMS09 |
| PO7946 | 6,044,646 | MEMS10 |
| PO9393 | 09/113,065 | MEMS11 |
| PP0875 | 09/113,078 | MEMS12 |
| PP0894 | 09/113,075 | MEMS13 |

STATEMENT REGARDING FEDERALLY SPONSORED RESEARCH OR DEVELOPMENT

Not applicable.

FIELD OF THE INVENTION

The field of the invention relates to the field of inkjet printing and in particular, discloses a method of manufacture of an inkjet printhead arrangement including a dual nozzle single horizontal fulcrum actuator inkjet.

BACKGROUND OF THE INVENTION

Many ink jet printing mechanisms are known. Unfortunately, in mass production techniques, the production of ink jet heads is quite difficult. For example, often, the orifice or nozzle plate is constructed separately from the ink supply and ink ejection mechanism and bonded to the mechanism at a later stage (Hewlett-Packard Journal, Vol. 36 no 5, pp33–37 (1985)). These separate material processing steps required in handling such precision devices often adds a substantial expense in manufacturing.

Additionally, side shooting ink jet technologies (U.S. Pat. No. 4,899,181) are often used but again, this limits the amount of mass production throughput given any particular capital investment.

Additionally, more esoteric techniques are also often utilised. These can include electroforming of nickel (Hewlett-Packard Journal, Vol. 36 no 5, pp33–37 (1985)), electrodischarge machining, laser ablation (U.S. Pat. No. 5,208,604), micro-punching, etc.

The utilisation of the above techniques is likely to add substantial expense to the mass production of ink jet printheads and therefore add substantially to their final cost.

It would therefore be desirable if an efficient system for the mass production of ink jet printheads could be developed.

With any inkjet printing arrangement, particularly those formed in a page wide inkjet printhead, it is desirable to minimise the dimensions of the arrangement so as to ensure compact economical construction. Further, it is desirable to provide for energy efficient operation.

SUMMARY OF THE INVENTION

It is an object of the present invention to provide for the manufacture of an alternative form of inkjet printhead including a multi-nozzled arrangement wherein a single actuator is utilised to eject ink from multiple nozzles.

In accordance with a first aspect of the present invention, there is provided a method of manufacturing a dual nozzle single horizontal fulcrum actuator ink jet printhead wherein an array of nozzles are formed on a substrate utilising planar monolithic deposition, lithographic and etching processes.

Multiple ink jet heads are preferably formed simultaneously on a single planar substrate which can comprise a silicon wafer.

The printheads are preferably formed utilising standard vlsi/ulsi processing. Integrated drive electronics are preferably formed on the same substrate. The integrated drive electronics are formed by a CMOS fabrication process.

Ink can be ejected from the substrate substantially normal to the substrate.

In accordance with a further aspect of the present invention, there is provided a method of manufacture of an ink jet printer which preferably can include a nozzle chamber having at least two fluid ejection apertures defined in the walls of the chamber; a moveable paddle vane located in a plane adjacent the rim of a first one of the fluid ejection apertures; an actuator mechanism attached to the moveable paddle vane and adapted to move the paddle vane in a first direction so as to cause the ejection of fluid drops out of the first fluid ejection aperture and to further move the paddle vane in a second alternative direction so as to cause the ejection of fluid drops out of a second fluid ejection aperture, the method comprising the steps of: (a) initially providing a silicon wafer having a circuitry wafer layer including the electrical circuitry necessary for the operation of the actuator mechanism on demand; (b) etching a trough in the wafer to provide for an ink supply channel through a portion of the wafer; (c) creating the nozzle chamber and the actuation mechanism and the paddle vane within the nozzle chamber on the silicon wafer by means of depositing and etching a series of sacrificial layers to form a supporting structure for the nozzle chamber, the actuation mechanism and the paddle vane, in addition to depositing and suitably etching a series of materials for forming the nozzle chamber, the actuation mechanism and the paddle vane; (d) etching an ink supply channel interconnecting the nozzle chamber through the wafer; and (e) etching away any remaining sacrificial layers so as to release the actuation mechanism and the paddle vane for operation.

The step (c) can comprise the steps of: (i)depositing and etching a first series of sacrificial layers to form a first supporting structure; (ii)depositing and etching a first non-conductive material layer to form a first structure including a portion of the nozzle chamber and a first portion of the actuation mechanism; (iii)depositing and etching a first conductive material layer to form a lower heater structure of the actuation mechanism; (iv)depositing and etching a second non-conductive material layer forming a central portion of the actuation mechanism, a portion of the nozzle wall and the paddle vane in addition to a supporting structure for an upper heater structure; (v)depositing and etching a second conductive material layer to form an upper heater structure of the actuation mechanism; (vi)depositing and etching a further third non-conductive material layer so as to form the paddle vane, the nozzle chamber walls and a portion affixing one end of the actuation mechanism to the wafer; (vii) depositing and etching a further sacrificial layer to form a further supporting structure for the nozzle chamber walls; (viii)depositing and etching a further fourth non-conductive material layer forming the nozzle chamber walls and roof in addition to the fluid ejection apertures; (ix)etching an ink supply channel through the wafer for the supply of ink to the nozzle chamber.

The first and second conductive material can comprise substantially a copper nickel alloy and the non-conductive material can comprise substantially silicon dioxide.

The sacrificial layers can comprise substantially glass and/or aluminium.

The steps are preferably also utilized to simultaneously separate the wafer into separate printheads.

BRIEF DESCRIPTION OF THE DRAWINGS

Notwithstanding any other forms which may fall within the scope of the present invention, preferred forms of the invention will now be described, by way of example only, with reference to the accompanying drawings in which:

FIG. 7 shows a schematic side view of an initial stage in the manufacture of an ink jet nozzle of the invention and step of etching a CMOS layer and silicon wafer layer;

FIG. 8 shows a step of depositing and etching a sacrificial material layer;

FIG. 19 shows a step of still further etching the third glass layer;

FIG. 20 shows a step of depositing a further sacrificial material layer;

FIG. 23 shows a step of back etching through the silicon wafer layer;

FIG. 24 shows a step of etching the sacrificial material layer;

DESCRIPTION OF PREFERRED AND OTHER EMBODIMENTS

In the preferred embodiment, an inkjet printing system is provided for the projection of ink from a series of nozzles. In the preferred embodiment a single paddle is located within a nozzle chamber and attached to an actuator device. When the nozzle is actuated in a first direction, ink is ejected through a first nozzle aperture and when the actuator is activated in a second direction causing the paddle to move in a second direction, ink is ejected out of a second nozzle. Turning initially to FIGS. 1–5, there will now be illustrated in a schematic form, the operational principles of the preferred embodiment.

Figure 1:
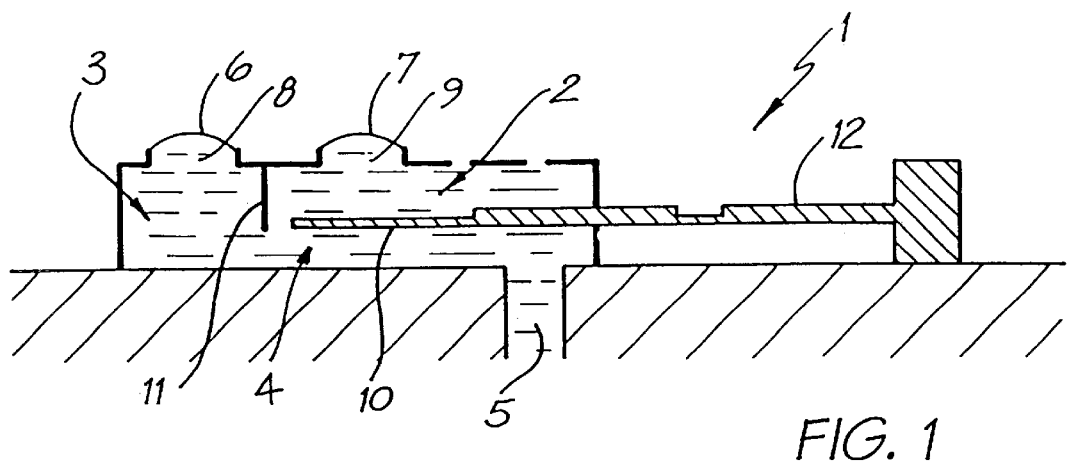
FIG. 1 shows a schematic side view of an ink jet nozzle of the invention a quiescent state.

Turning initially to FIG. 1, there is shown a nozzle arrangement 1 of the preferred embodiment when in its quiescent state. In the quiescent state, ink fills a first portion 2 of a nozzle chamber 4 and a second portion 3 of the nozzle chamber 4. The ink fills the nozzle chamber 4 from an ink supply channel 5 to the point that a meniscus 6, 7 is formed around corresponding nozzle holes 8,9. A paddle 10 is provided within the nozzle chamber 4 with the paddle 10 being interconnected to an actuator device 12, which comprises a thermal actuator which can be actuated so as to cause the actuator 12 to bend, as will be become more apparent hereinafter.

Figure 2:
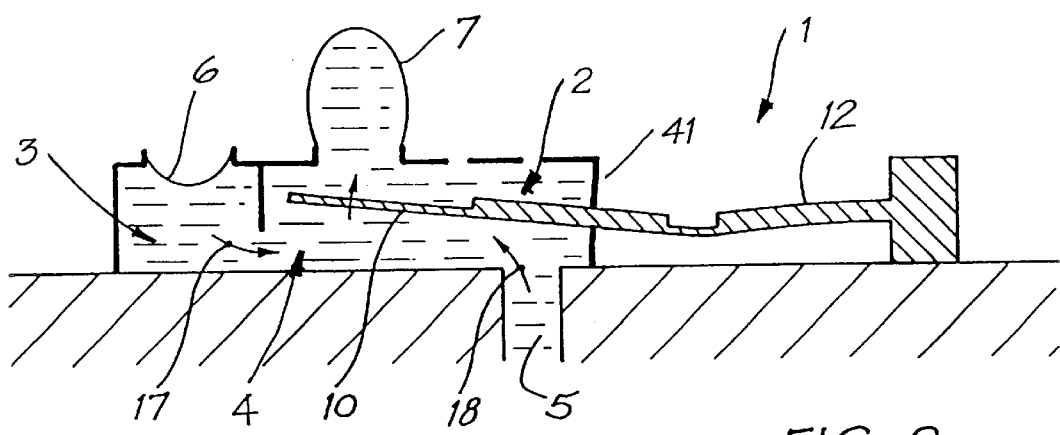
FIG. 2 shows a schematic side view of the nozzle is an initial part of an ink ejection stage from a first nozzle opening of the nozzle.
Figure 3:
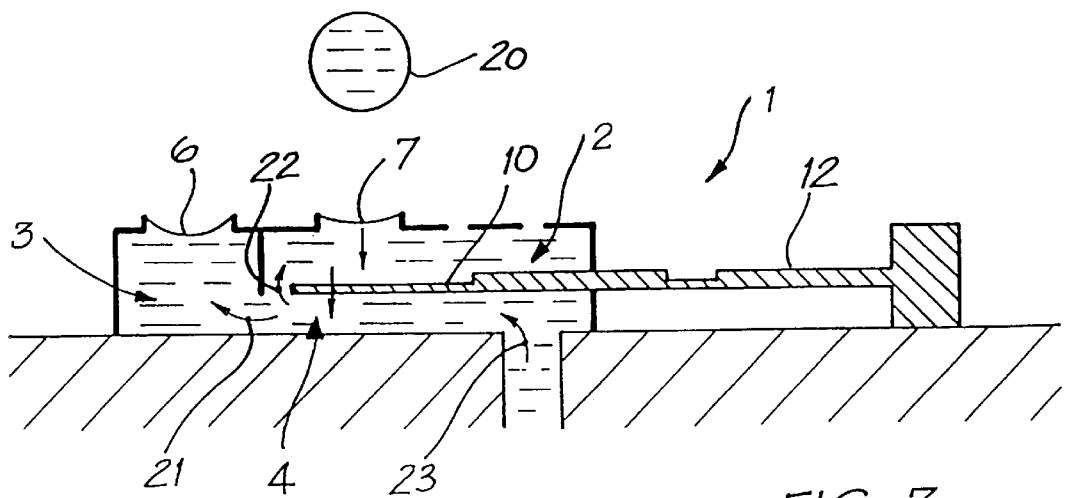
FIG. 3 shows a schematic side view of the nozzle in a further part of an ink ejection stage from the first nozzle opening.

In order to eject ink from the first nozzle hole 9, the actuator 12 is activated so as to bend as illustrated in FIG. 2. The bending of actuator 12 causes the paddle 10 to rapidly move upwards which causes a substantial increase in the pressure of the fluid, such as ink, within portion 2 of nozzle chamber 4 and adjacent to the meniscus 7. This results in a general rapid expansion of the meniscus 7 as ink flows through the nozzle hole 9 as a result of the increasing pressure. The rapid movement of paddle 10 causes a reduction in pressure along the back surface of the paddle 10. This results in general flows as indicated 17, 18 from the second portion 3 of nozzle chamber 4 and the ink supply channel 5. Next, while the meniscus 7 is extended, the actuator 12 is deactivated resulting in the return of the paddle 10 to its quiescent position as indicated in FIG. 3. The return of the paddle 10 operates against the forward momentum of the ink adjacent the meniscus 7 which subsequently results in the breaking off of the meniscus 7 so as to form the drop 20 as illustrated in FIG. 3. The drop 20 continues onto the print media. Further, surface tension effects on the ink meniscus 7 and ink meniscus 6 result in ink flows 21–23 which replenish the nozzle chamber 4. Eventually, the paddle 10 returns to its quiescent position and the situation is again as illustrated in FIG. 1.

Figure 4:
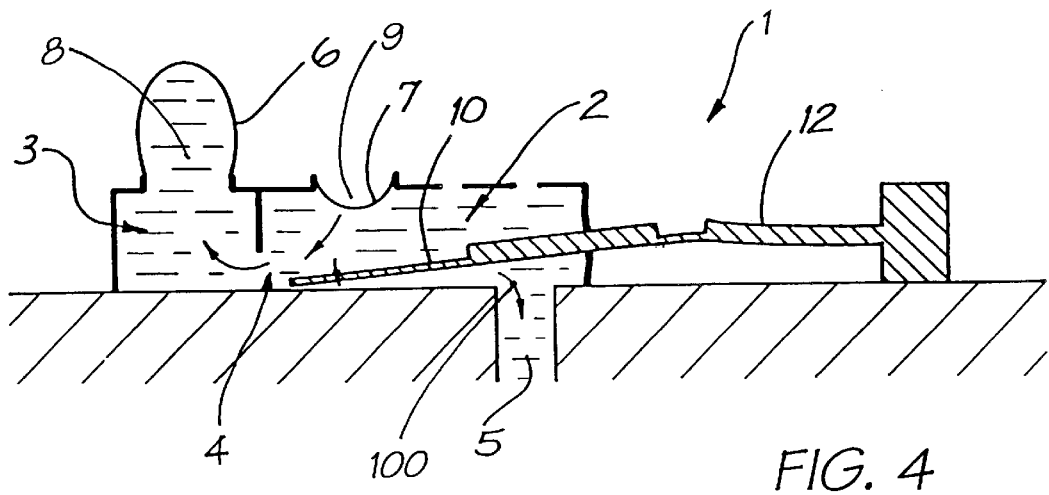
FIG. 4 shows a schematic side view of the nozzle in an initial part of an ink ejection stage from a second nozzle opening of the nozzle.
Figure 5:
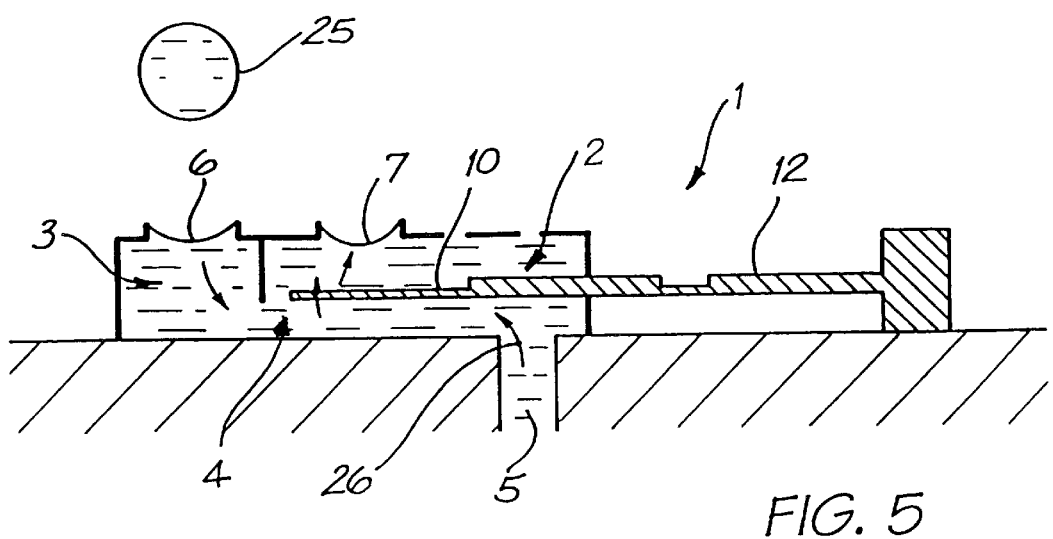
FIG. 5 shows a schematic side view of the nozzle in a further part of an ink ejection stage from the second nozzle opening.

Subsequently, when it is desired to eject a drop via ink ejection hole 8, the actuator 12 is activated as illustrated in FIG. 4. The activation of the actuator 12 causes the paddle 10 to move rapidly down causing a substantial increase in pressure in the portion 3 of the nozzle chamber 4 which results in a rapid growth of the meniscus 6 around the nozzle hole 8. This rapid growth is accompanied by a general collapse in meniscus 7 as the ink is sucked back into the portion 2 of the chamber 4. Further, ink flow, as illustrated by arrow 100, also occurs into ink supply channel 5. However, hopefully this ink flow is minimised. Subsequently, as indicated in FIG. 5, the actuator 12 is deactivated resulting in the return of the paddle 10 to its quiescent position. The return of the paddle 10 results in a general lessening of pressure within the portion 3 of the nozzle chamber 4 as ink is sucked back into the area under the paddle 10. The forward momentum of the ink surrounding the meniscus 6 and the backward momentum of the other ink within portion 3 of the nozzle chamber 4 is resolved through the breaking off of an ink drop 25 which proceeds towards the print media. Subsequently, the surface tension on the meniscus 6 and 7 results in a general ink inflow 26 from ink supply channel 5 resulting in the arrangement returning to the quiescent state as indicated in FIG. 1.

It can therefore be seen that the schematic illustration of FIG. 1 to FIG. 5 describes a system where a single planar paddle is actuated so as to eject ink from multiple nozzles.

Figure 6:
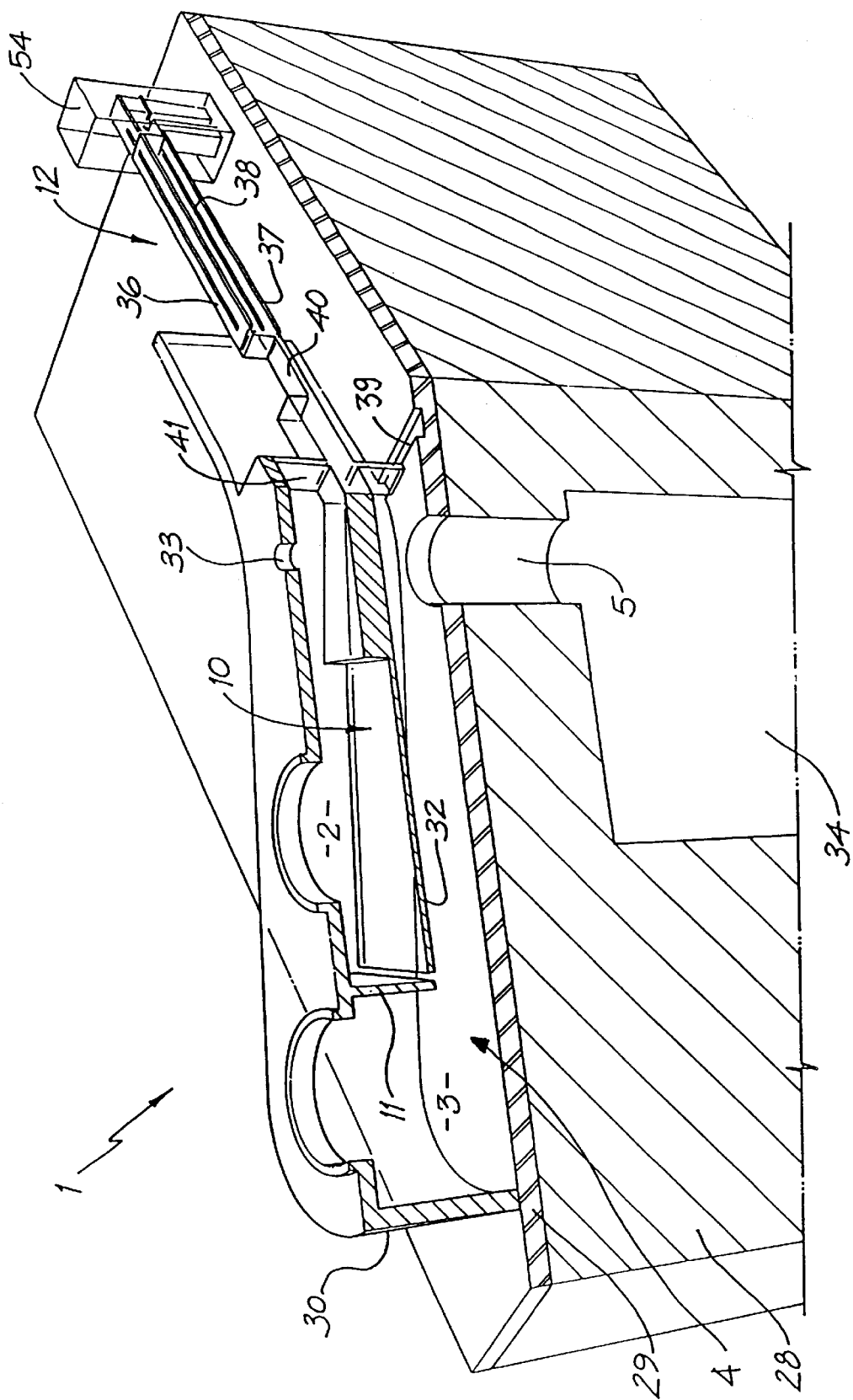
FIG. 6 is a perspective view, partly in section of one form of construction of the preferred embodiment.

Turning now to FIG. 6, there is illustrated a sectional view through one form of implementation of a single nozzle arrangement 1. The nozzle arrangement 1 can be constructed on a silicon wafer base 28 through the construction of large arrays of nozzles at one time utilising standard micro electromechanical processing techniques.

An array of nozzles on a silicon wafer device can be constructed utilising semiconductor processing techniques in addition to micro machining and micro fabrication process technology. (MEMS) and a full familiarity with these technologies is hereinafter assumed.

For a general introduction to a micro-electro mechanical system (MEMS) reference is made to standard proceedings in this field including the proceeding of the SPIE (International Society for Optical Engineering) including volumes 2642 and 2882 which contain the proceedings of recent advances and conferences in this field.

One form of construction will now be described with reference to FIGS. 7 to 24. On top of the silicon wafer 28 is first constructed a CMOS processing layer 29 which can provide for the necessary interface circuitry for driving the thermal actuator and its interconnection with the outside world. The CMOS layer 29 is suitably passivated so as to protect it from subsequent MEMS processing techniques. The walls eg. 30 can be formed from glass ($SiO_2$). Preferably, the paddle 10 includes a thinned portion 32 for more efficient operation. Additionally, a sacrificial etchant hole 33 is provided for allowing more effective etching of sacrificial etchants within the nozzle chamber 4. The ink supply channel 5 is generally provided for interconnecting an ink inlet 34 which can be etched through the wafer 28 by means of utilisation of a deep anisotropic trench etcher such as that available from Silicon Technology Systems of the United Kingdom.

The arrangement 1 further includes a thermal actuator device eg. 12 which includes two arms comprising an upper arm 36 and a lower arm 37 formed around a glass core 38. Both upper and lower arm heaters 36, 37 can comprise a 0.4μ film of 60% copper and 40% nickel hereinafter known as (Cupronickel) alloy. Copper and nickel is used because it has a high bend efficiency and is also highly compatible with standard VLSI and MEMS processing techniques. The bend efficiency can be calculated as the square of the coefficient of the thermal expansion times the Young's modulus, divided by the density and divided by the heat capacity. This provides a measure of the amount of "bend energy" produced by a material per unit of thermal (and therefore electrical) energy supplied.

The core can be fabricated from glass which also has many suitable properties in acting as part of the thermal actuator. The actuator 12 includes a thinned portion 40 for providing an interconnect between the actuator 12 and the paddle 10. The thinned portion 40 provides for nondestructive flexing of the actuator 12. Hence, when it is desired to actuate the actuator 12, say to cause it to bend downwards, a current is passed through the top cupronickel layer causing it to be heated and expand. This in turn causes a general bending due to the thermocouple relationship between the layers 36 and 37. The bending down of the actuator 12 also causes thinned portion 40 to move downwards in addition to the portion 41. Hence, the paddle 10 is pivoted around the wall 41 which can, if necessary, include slots for providing for efficient bending. Similarly, the heater arm 37 can be operated so as to cause the actuator 12 to bend up with the consequential movement upon the paddle 10.

A pit 39 is provided adjacent to the wall of the nozzle chamber to ensure that any ink outside of the nozzle chamber has minimal opportunity to "wick" along the surface of the printhead as the wall 41 can be provided with a series of slots to assist in the flexing of the fulcrum.

Figure 9:
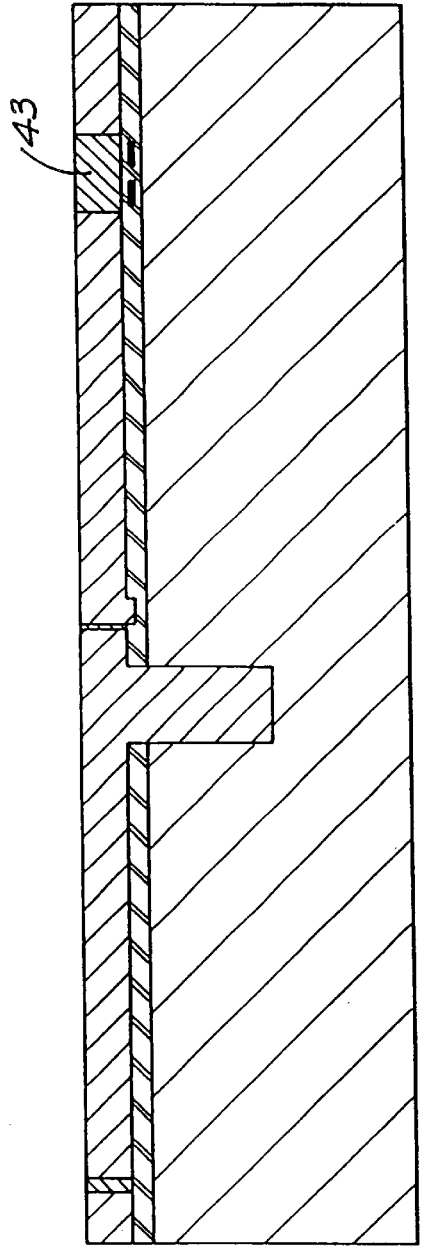
FIG. 9 shows a step of depositing a first layer.
Figure 10:
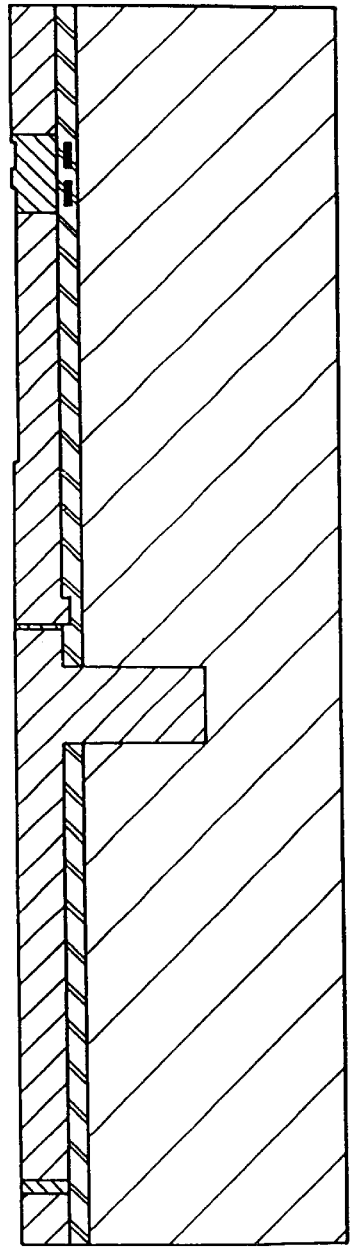
FIG. 10 shows a step of etching the sacrificial material later and the first glass layer.
Figure 11:
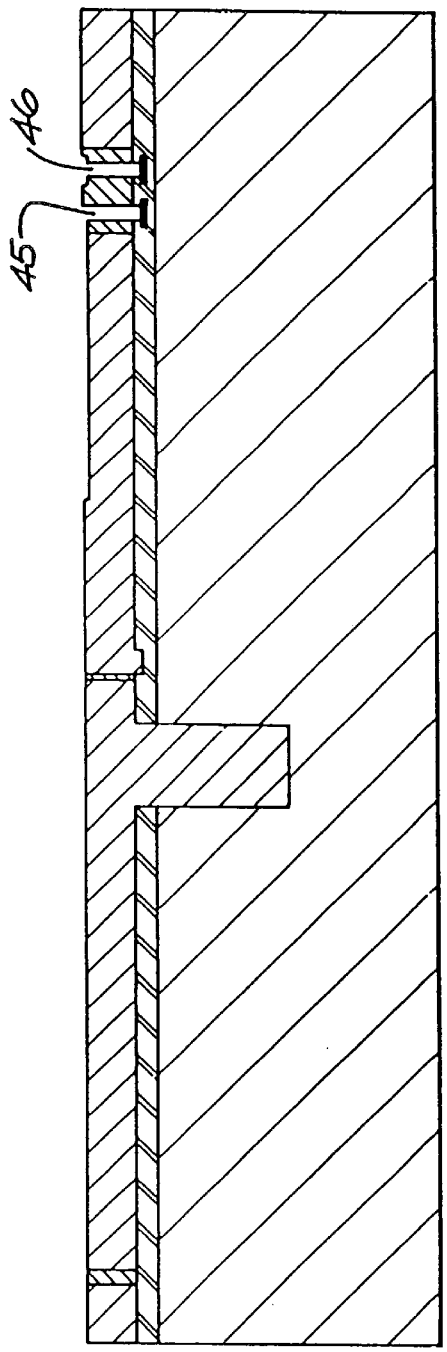
FIG. 11 shows a step of further etching the first glass layer.
Figure 12:
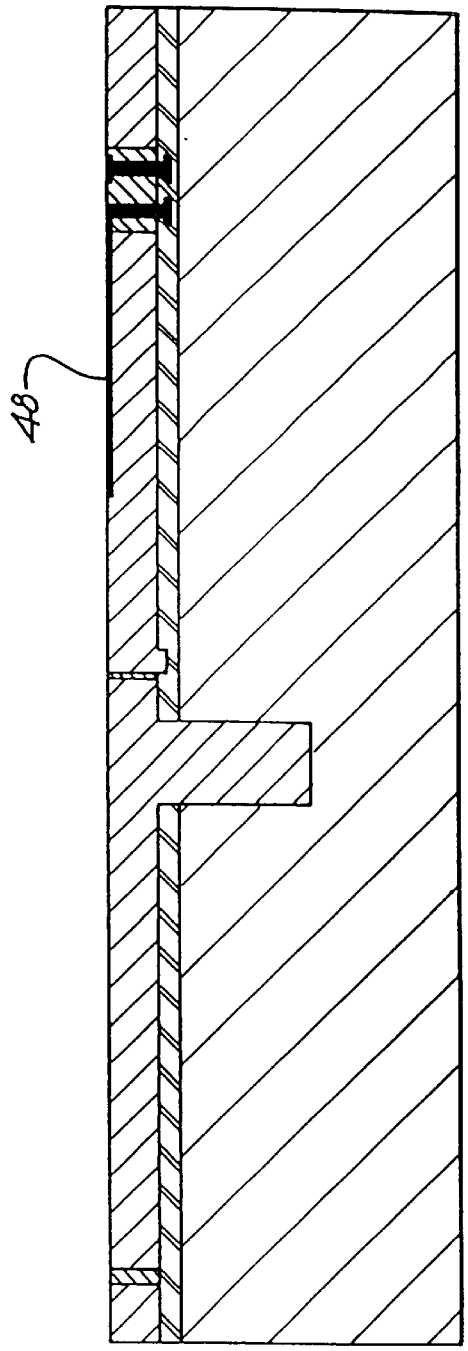
FIG. 12 shows a step of depositing a heater material layer.
Figure 13:
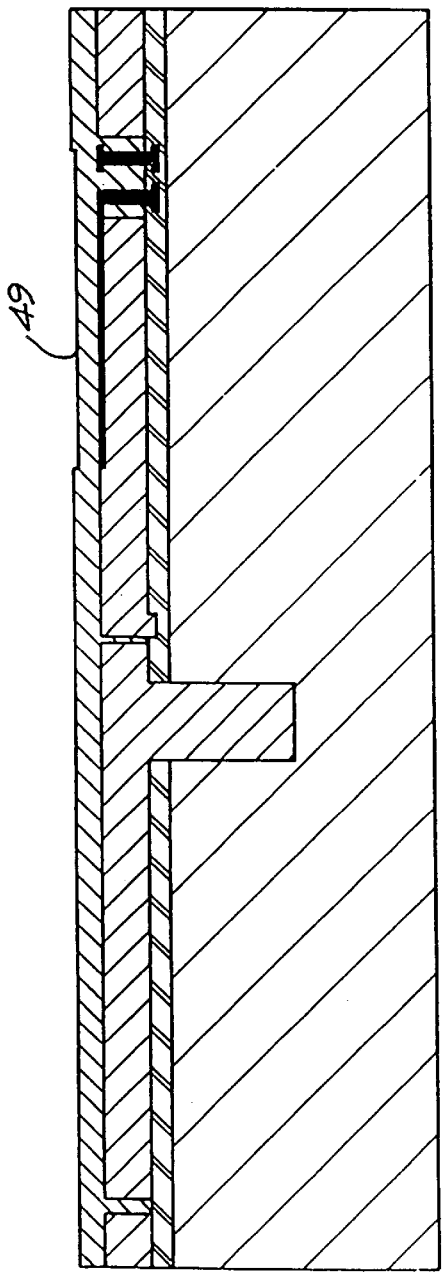
FIG. 13 shows a step of depositing and etching a second glass layer.
Figure 14:
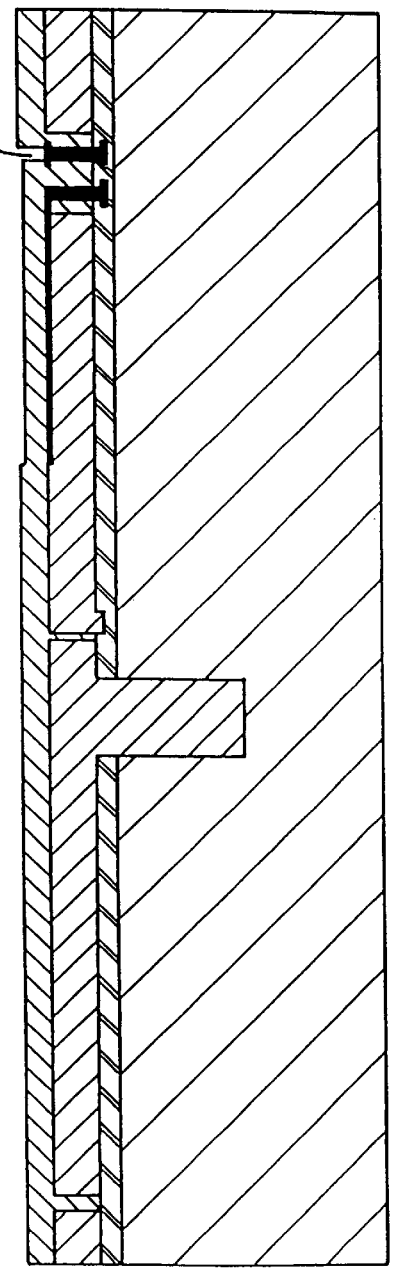
FIG. 14 shows a step of further etching the second glass layer.
Figure 15:
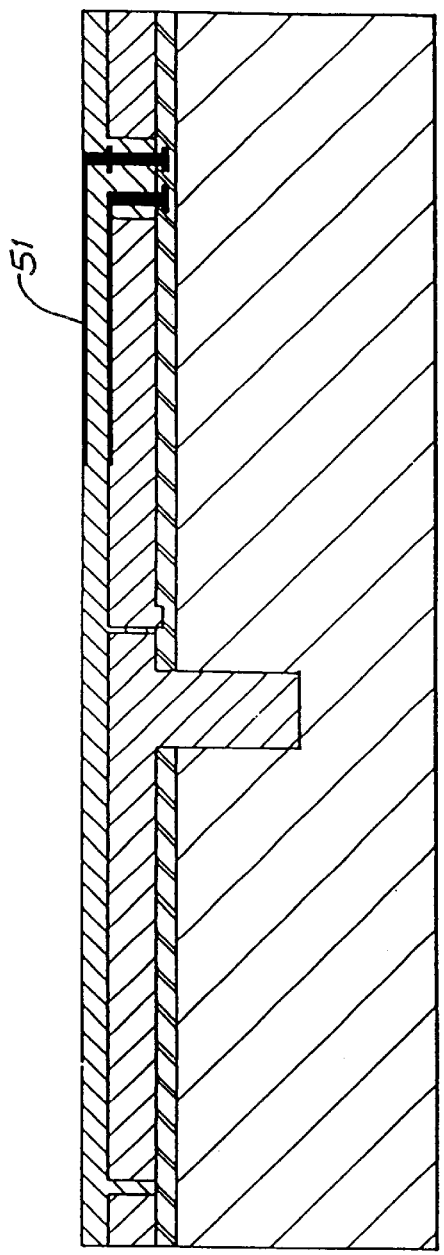
FIG. 15 shows a step of depositing a further heater material layer.
Figure 16:
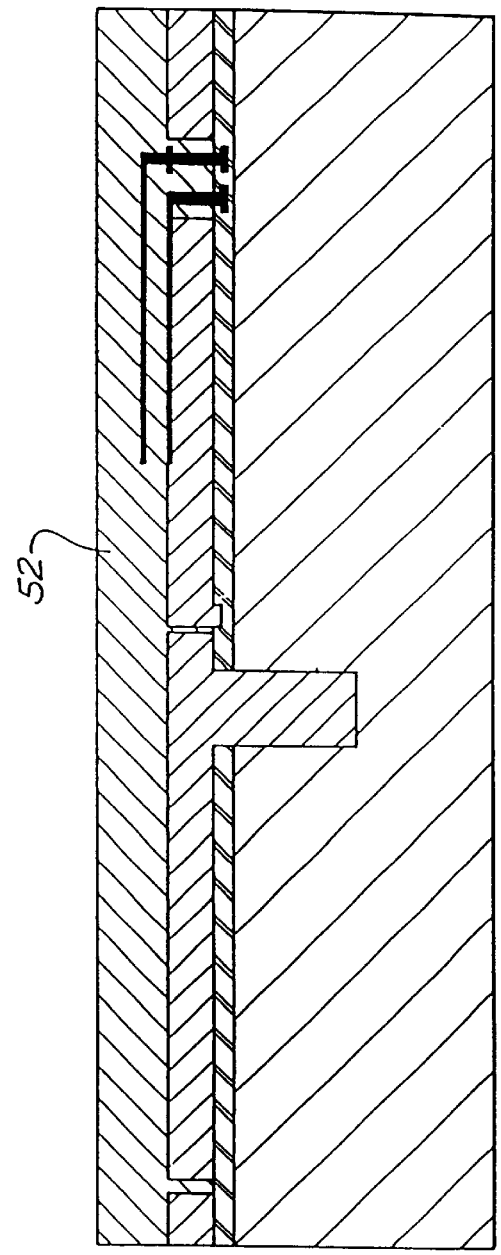
FIG. 16 shows a step of depositing a third glass layer.
Figure 17:
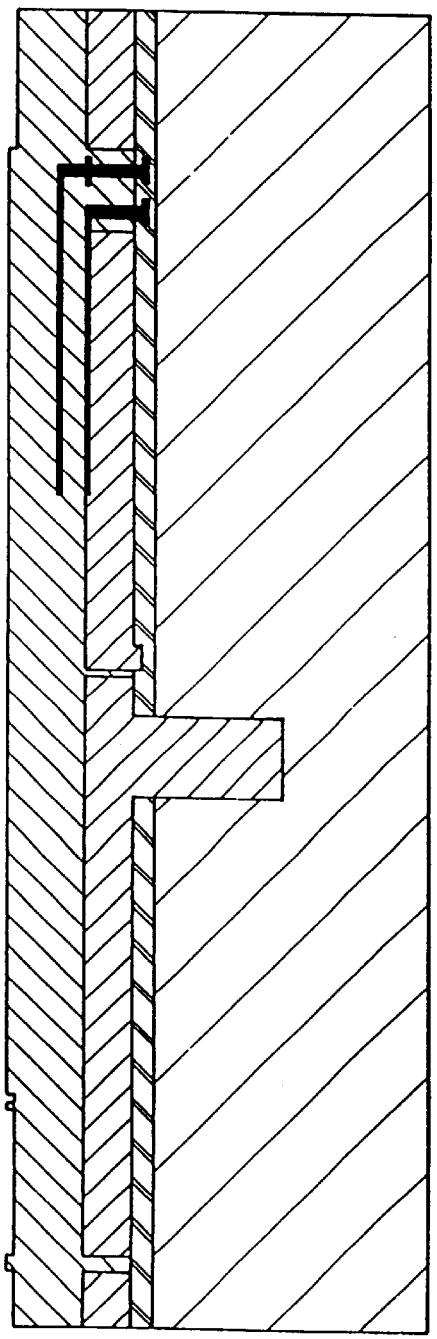
FIG. 17 shows a step of etching the third glass layer.
Figure 18:
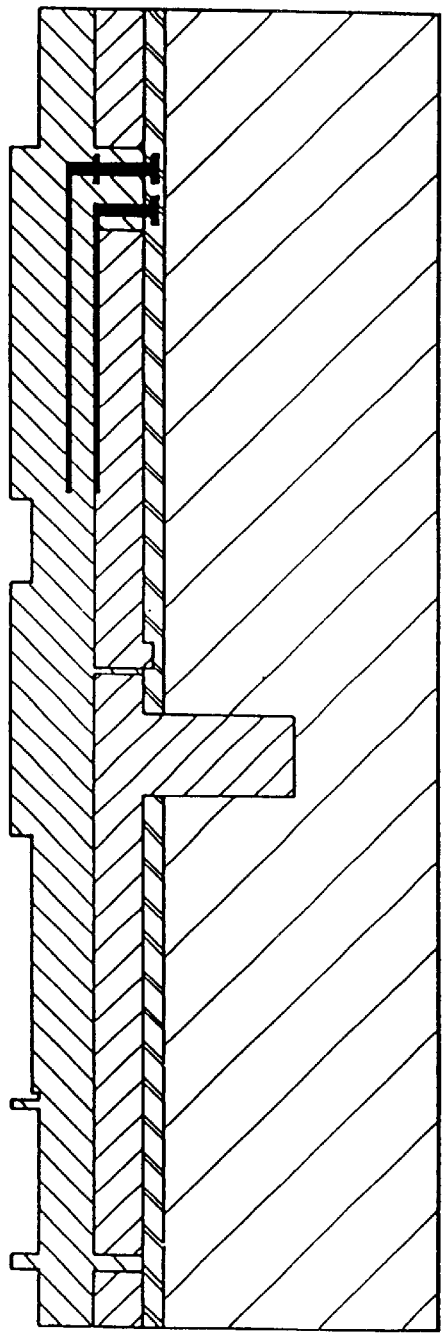
FIG. 18 shows a step of further etching said third glass layer.
Figure 21:
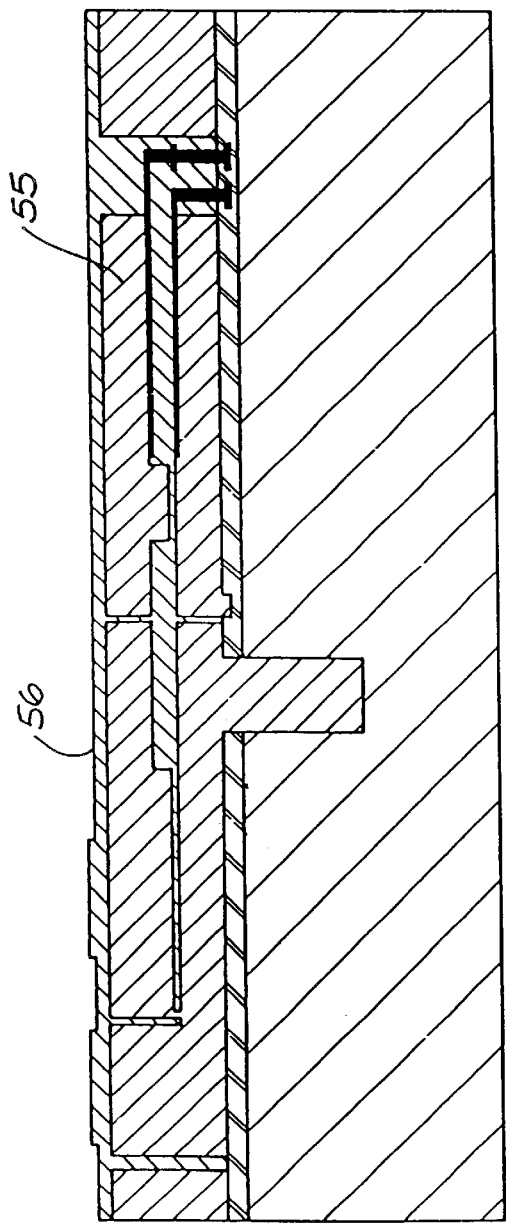
FIG. 21 shows a step of depositing a fourth glass layer.
Figure 22:
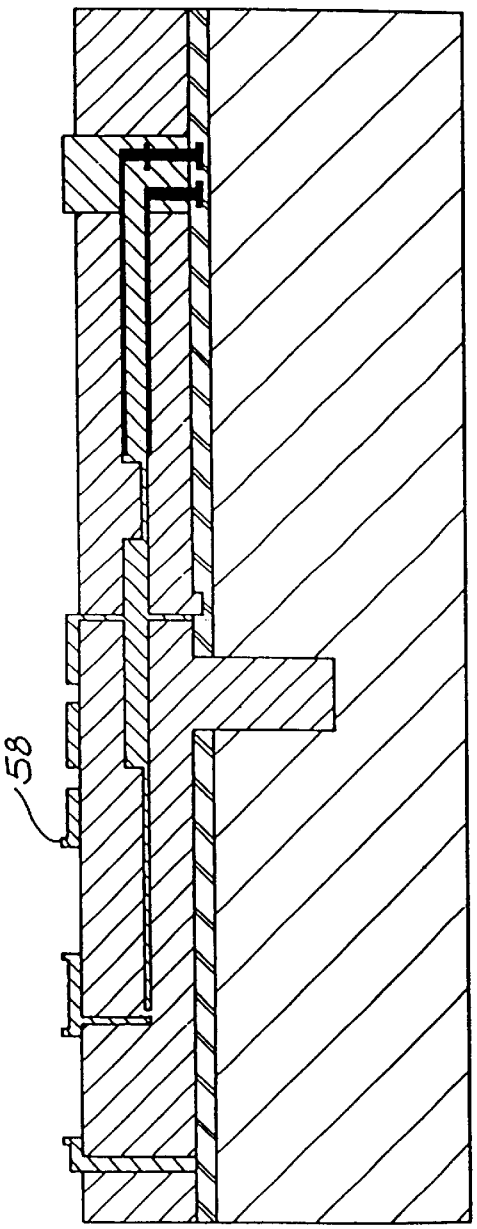
FIG. 22 shows a step of etching the fourth glass layer.

Turning now to FIGS. 7–24, there will now be described one form of processing construction of the preferred embodiment of FIG. 6. This can involve the following steps:

1. Initially, as illustrated in FIG. 7, starting with a fully processed CMOS wafer 28 the CMOS layer 29 is deep silicon etched so as to provide for the nozzle ink inlet 5.
2. Next, as illustrated in FIG. 8, a 7μ layer 42 of a suitable sacrificial material (for example, aluminium), is deposited and etched with a nozzle wall mask in addition to the electrical interconnect mask.
3. Next, as illustrated in FIG. 9, a 7μ layer of low stress glass 42 is deposited and planarised utilising chemical planarization.
4. Next, as illustrated in FIG. 10, the sacrificial material is etched to a depth of 0.4 micron and the glass to at least a level of 0.4 micron utilising a first heater mask.
5. Next, as illustrated in FIG. 11, the glass layer is etched as shown at 45, 46 down to the aluminium portions of the CMOS layer providing for an electrical interconnect utilising a first heater mask.
6. Next, as illustrated in FIG. 12, a 3 micron layer 48 of 50% copper and 40% nickel alloy is deposited and planarised utilising chemical mechanical planarization.
7. Next, as illustrated in FIG. 13, a 4 micron layer 49 of low stress glass is deposited and etched to a depth of 0.5 micron utilising a mask for the second heater.
8. Next, as illustrated in FIG. 14, the deposited glass layer is etched as at 50 down to the cupronickel utilising a second heater mask.
9. Next, as illustrated in FIG. 15, a 3 micron layer 51 of cupronickel is deposited and planarised utilising chemical mechanical planarization.
10. As illustrated in FIG. 16, next, a 7 micron layer 52 of low stress glass is deposited.
11. The glass 52 is etched, as illustrated in FIG. 17 to a depth of 1 micron utilising a first paddle mask.
12. Next, as illustrated in FIG. 18, the glass 52 is again etched to a depth of 3 micron utilising a second paddle mask with the first mask utilised in FIG. 17 etching away those areas not having any portion of the paddle and the second mask as illustrated in FIG. 18 etching away those areas having a thinned portion. Both the first and second mask of FIG. 17 and FIG. 18 can be a timed etch.
13. Next, as illustrated in FIG. 19, the glass 52 is etched to a depth of 7 micron using a third paddle mask. The third paddle mask leaves the nozzle wall 30, baffle 11, thinned wall 41 and end portion 54 which fixes one end of the thermal actuator firmly to the substrate.
14. The next step, as illustrated in FIG. 20, is to deposit an 11 micron layer 55 of sacrificial material such as aluminium and planarize the layer utilising chemical mechanical planarization.
15. As illustrated in FIG. 21, a 3 micron layer 56 of glass is deposited and etched to a depth of 1 micron utilising a nozzle rim mask.
16. Next, as illustrated in FIG. 22, the glass 56 is etched down to the sacrificial layer utilising a nozzle mask so as to form the nozzle structure 58.
17. The next step, as illustrated in FIG. 23, is to back etch an ink inlet 34 utilising a deep silicon trench etcher such as that available from Silicon Technology Systems. The printheads can also be diced by this etch.
18. Next, as illustrated in FIG. 24, the sacrificial layers are etched away by means of a wet etch and wash.

The printheads can then be inserted in an ink chamber moulding, tab bonded and a PTFE hydrophobic layer evaporated over the surface so as to provide for a hydrophobic surface.

Figure 25:
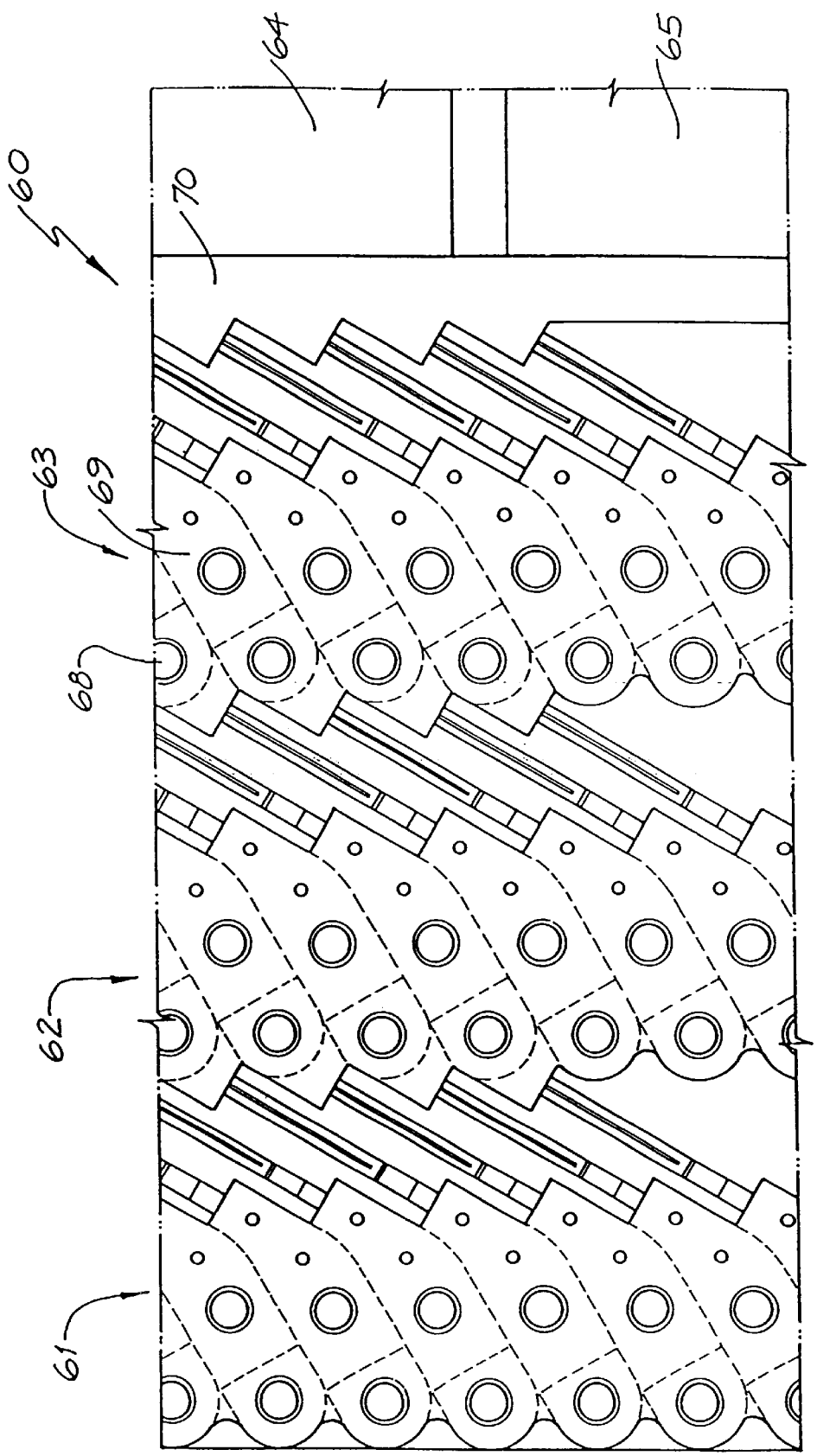
FIG. 25 illustrates an array view illustrating a portion of a printhead constructed in accordance with the preferred embodiment.

In FIG. 25, there is illustrated a portion of a pagewidth printhead including a series of nozzle arrangements as constructed in accordance with the principles of the preferred embodiment. The array 60 has been constructed for three colour output having a first row 61, a second row 62 and a third row 63. Additionally, a series of bond pads, eg. 64, 65 are provided at the side for tab automated bonding to the printhead. Each row 61, 62, 63 can be provided with a different colour ink including cyan, magenta and yellow for providing full colour output. The nozzles of each row 61–63 are further divided into sub rows eg. 68, 69. Further, a glass strip 70 can be provided for anchoring the actuators of the row 63 in addition to providing for alignment for the bond pads 64, 65.

The CMOS circuitry can be provided so as to fire the nozzles with the correct timing relationships. For example, each nozzle in the row 68 is fired together followed by each nozzle in the row 69 such that a single line is printed.

It could be therefore seen that the preferred embodiment provides for an extremely compact arrangement of an inkjet printhead which can be made in a highly inexpensive manner in large numbers on a single silicon wafer with large numbers of printheads being made simultaneously. Further, the actuation mechanism provides for simplified complexity in that the number of actuators is halved with the arrangement of the preferred embodiment.

The presently disclosed ink jet printing technology is potentially suited to a wide range of printing systems including: color and monochrome office printers, short run digital printers, high speed digital printers, offset press supplemental printers, low cost scanning printers high speed pagewidth printers, notebook computers with in-built pagewidth printers, portable color and monochrome printers, color and monochrome copiers, color and monochrome facsimile machines, combined printer, facsimile and copying machines, label printers, large format plotters, photograph copiers, printers for digital photographic "minilabs", video printers, PHOTO CD (PHOTO CD is a registered trade mark of the Eastman Kodak Company) printers, portable printers for PDAs, wallpaper printers, indoor sign printers, billboard printers, fabric printers, camera printers and fault tolerant commercial printer arrays.

Figure 26:
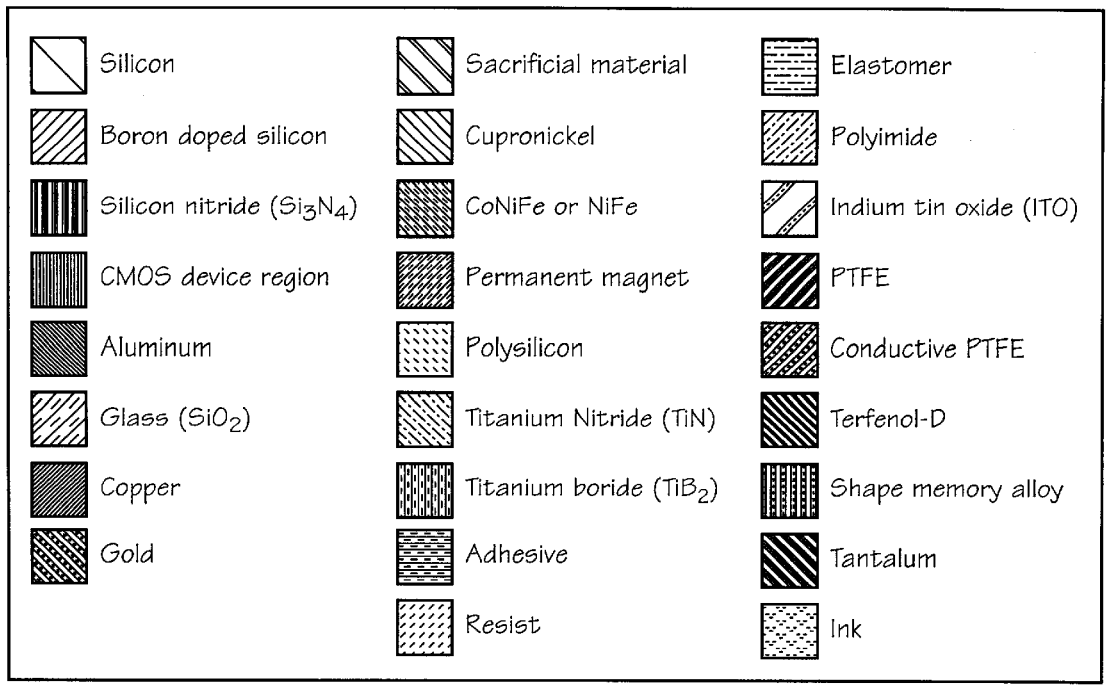
FIG. 26 provides a legend of the materials indicated in FIGS. 27 to 43.
Figure 27:
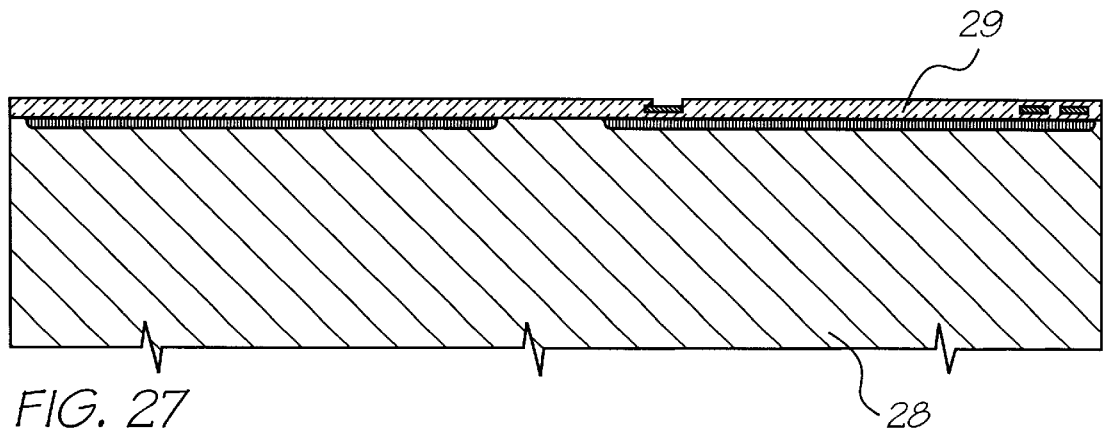
FIG. 27 shows a sectional side view of an initial manufacturing step of an ink jet printhead nozzle showing a silicon wafer and an electrical circuitry layer.
Figure 28:
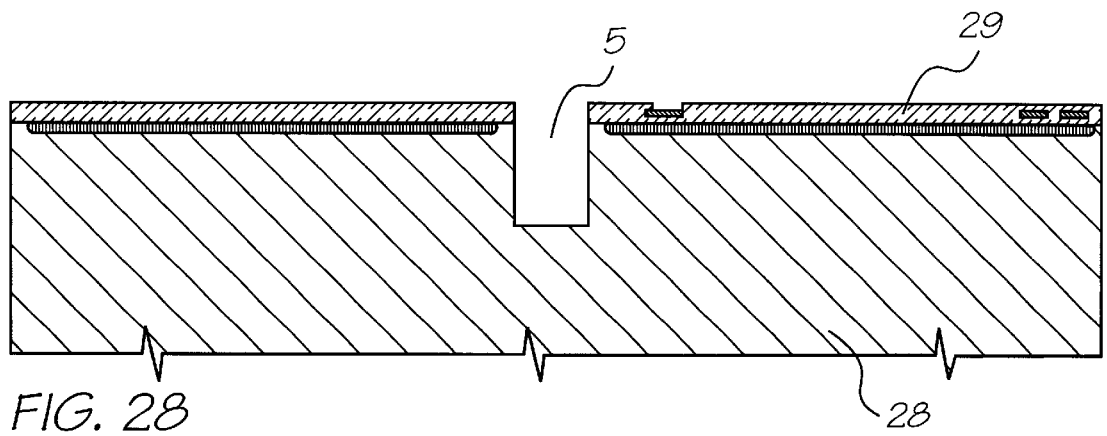
FIG. 28 shows a step of etching the silicon wafer layer and electrical circuitry layer.
Figure 29:
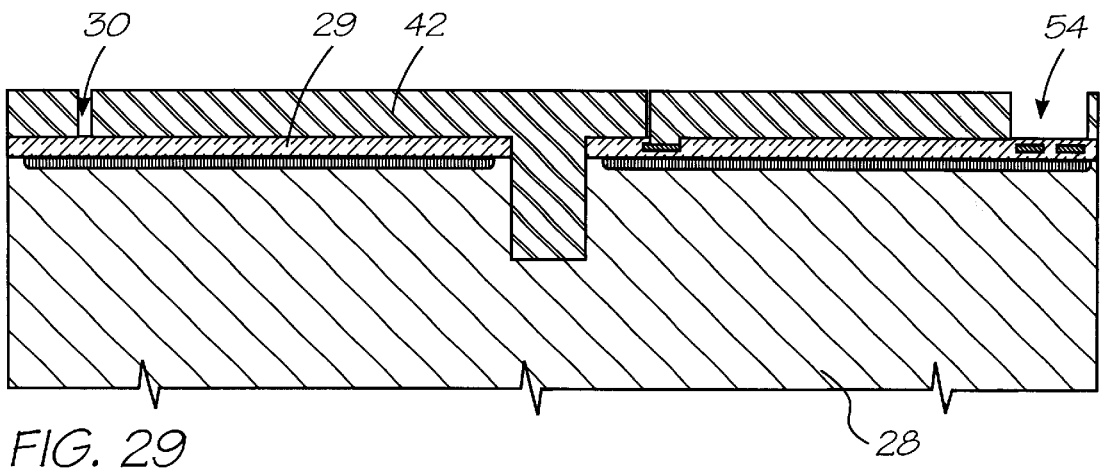
FIG. 29 shows a step of depositing and etching a first sacrificial material layer.
Figure 30:
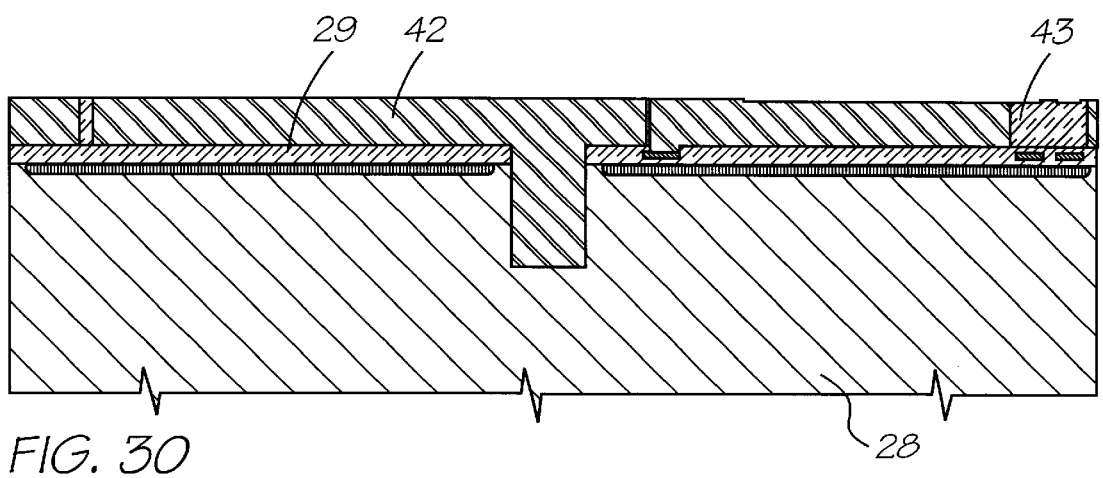
FIG. 30 shows a step of depositing and etching a first glass layer.
Figure 31:
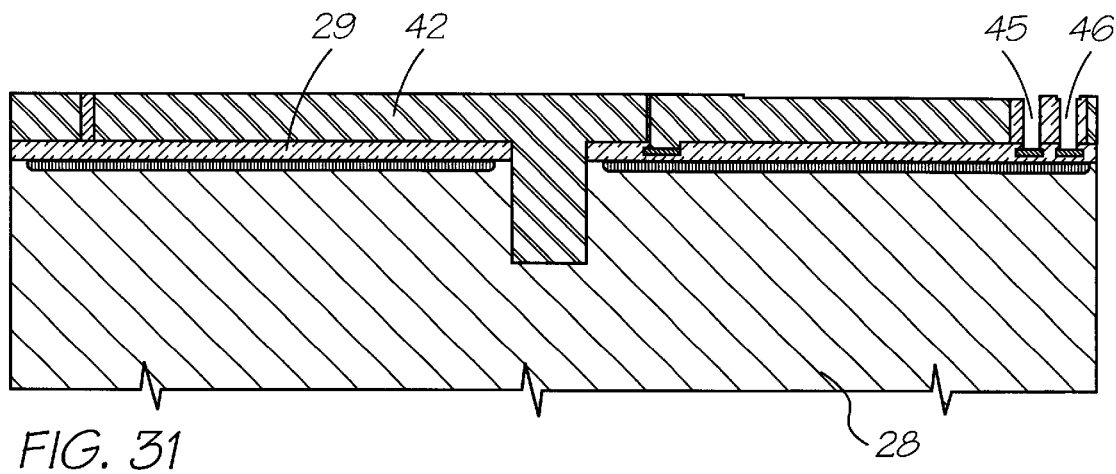
FIG. 31 shows a step of further etching the first glass layer.
Figure 32:
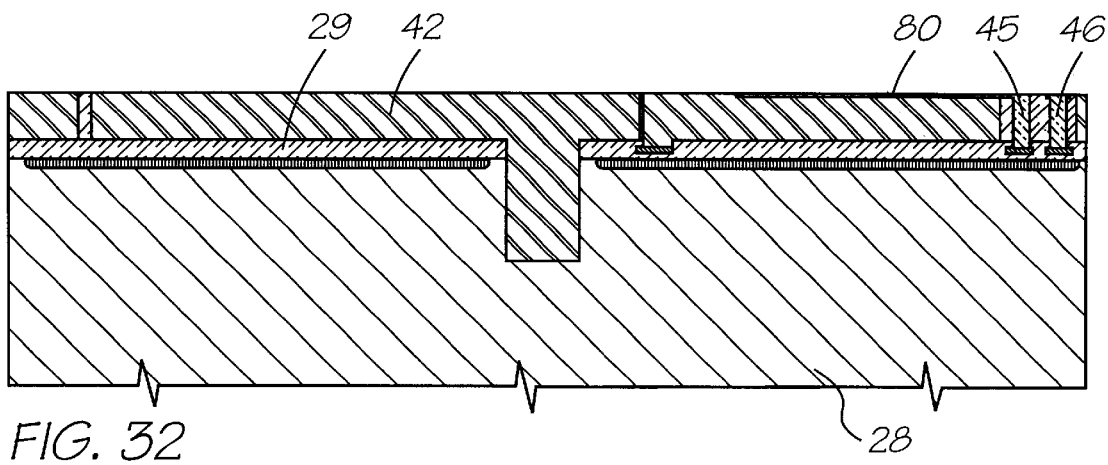
FIG. 32 shows a step of depositing a first heater material layer.
Figure 33:
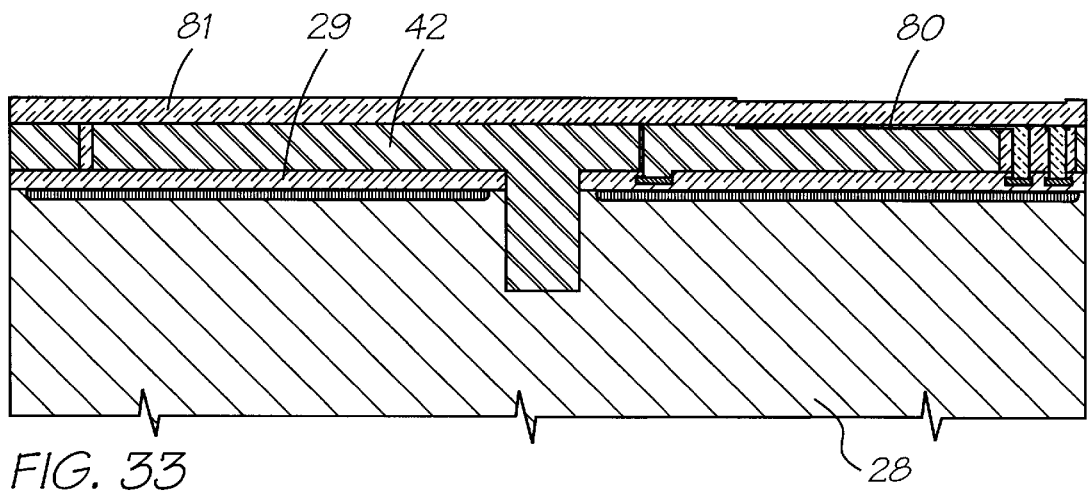
FIG. 33 shows a step of depositing and etching a second glass layer.
Figure 34:
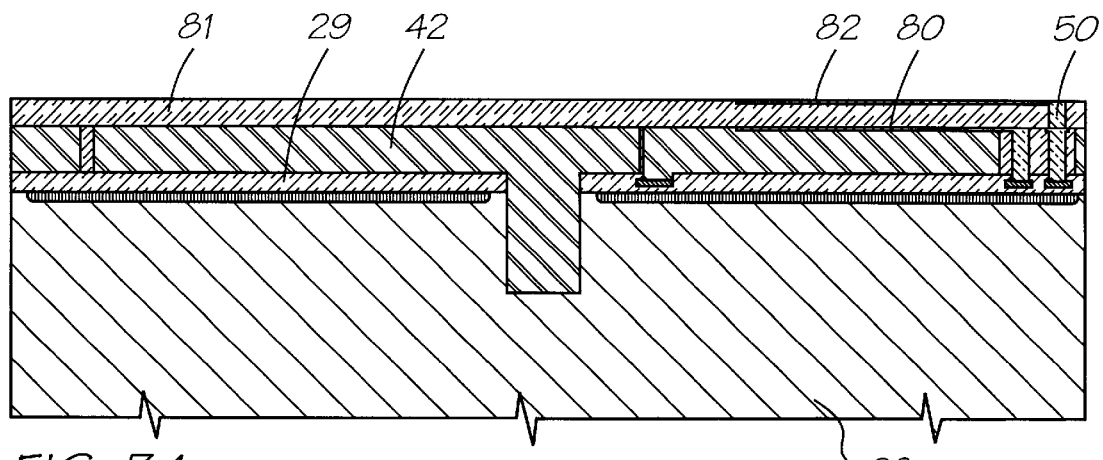
FIG. 34 shows a step of depositing a second heater material layer.
Figure 35:
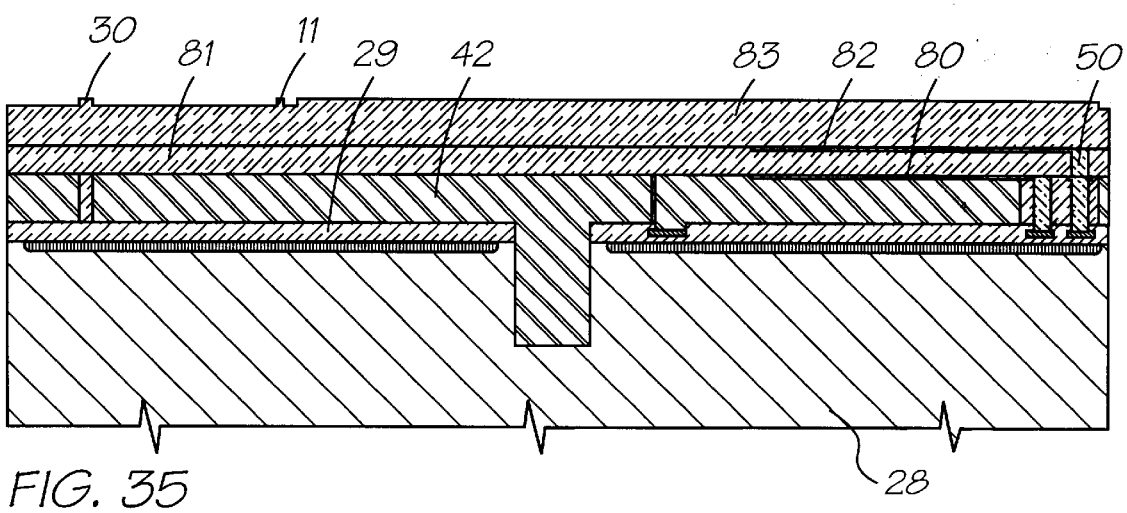
FIG. 35 shows a step of depositing and etching a third glass layer.
Figure 36:
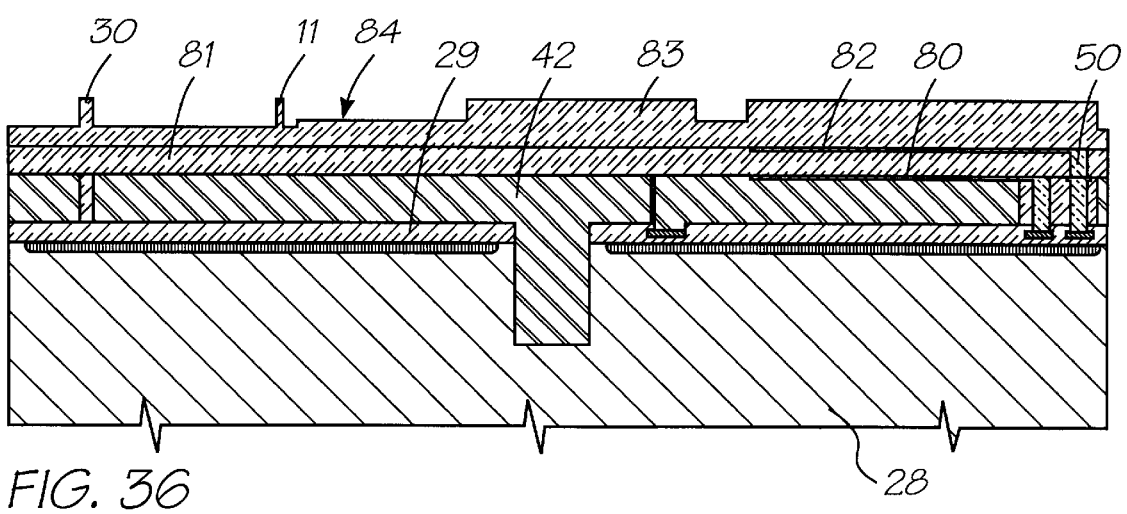
FIG. 36 shows a step of further etching the third glass layer.
Figure 37:
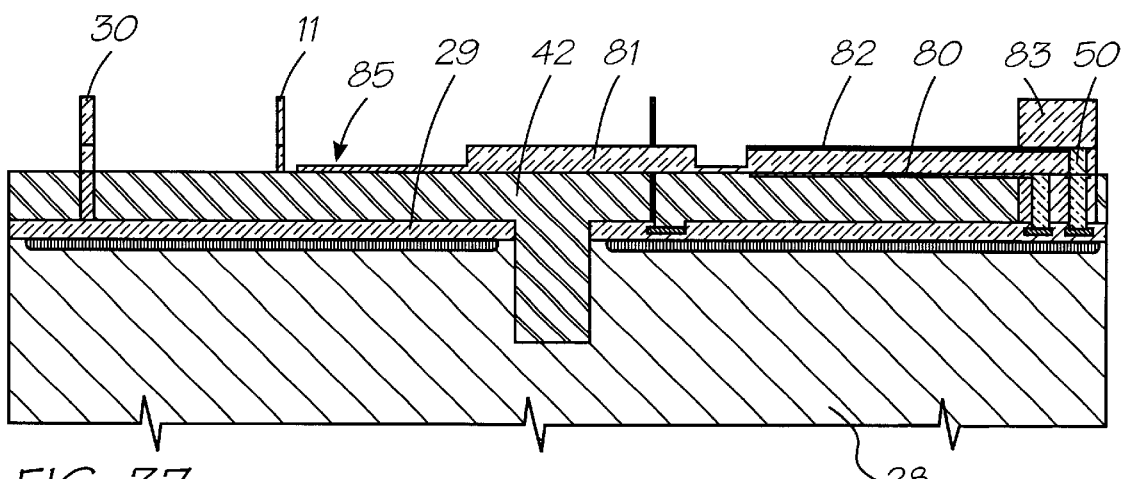
FIG. 37 shows a step of still further etching the third glass layer.
Figure 38:
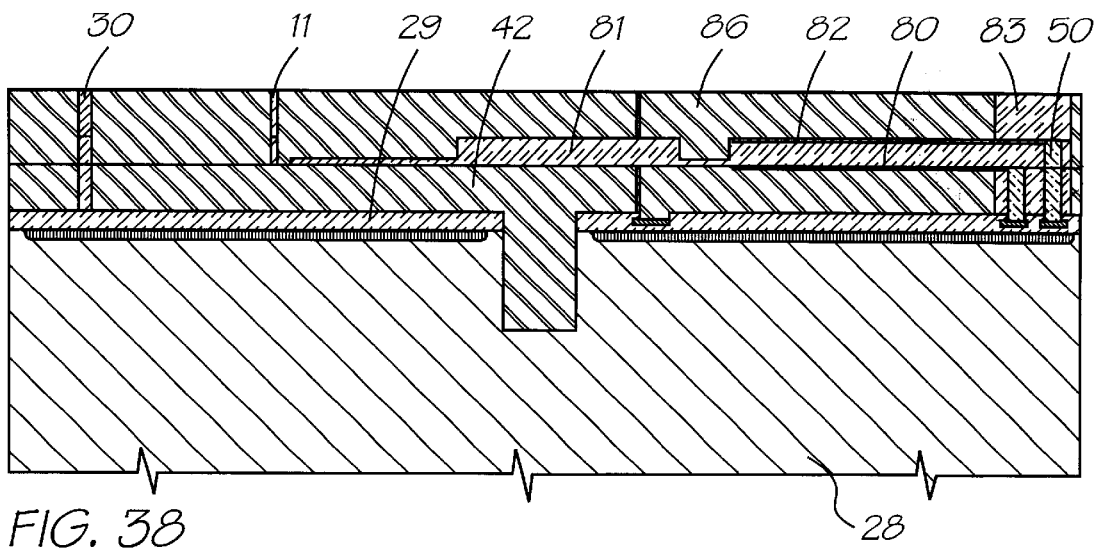
FIG. 38 shows a step of depositing a further sacrificial material layer.
Figure 39:
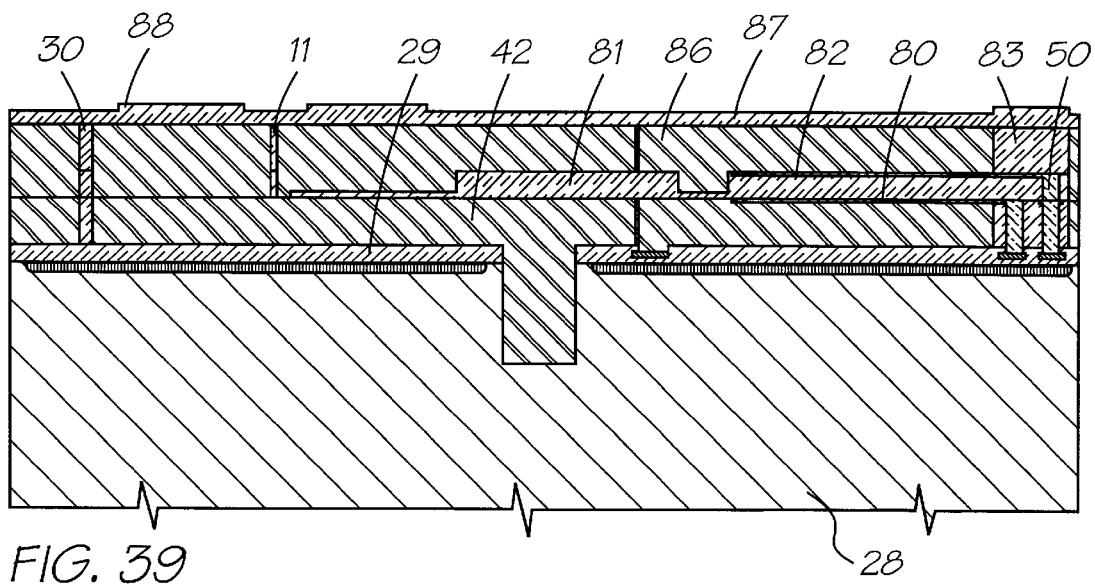
FIG. 39 shows a step of depositing and etching a fourth glass layer.
Figure 40:
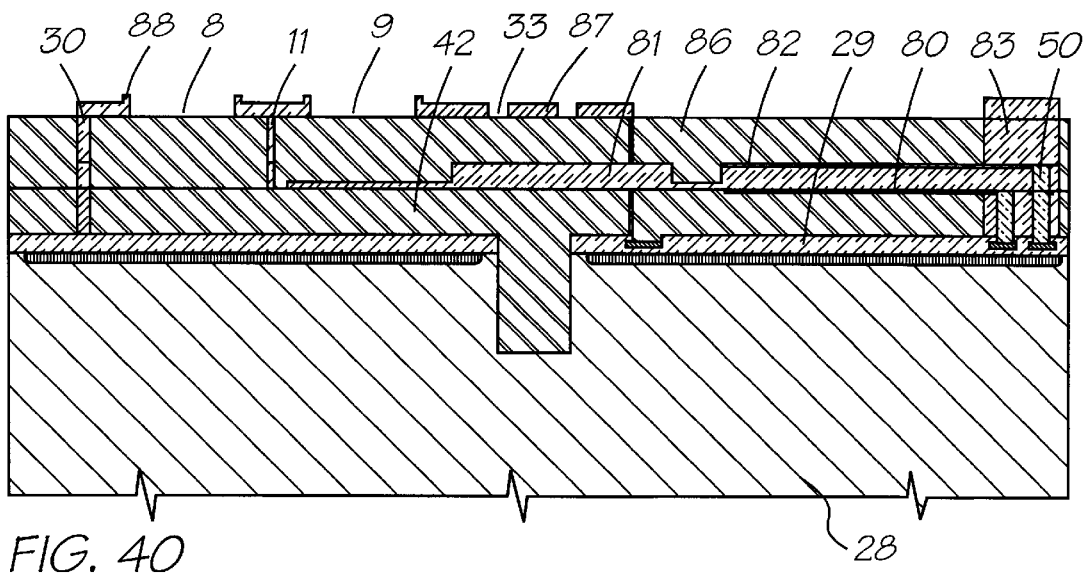
FIG. 40 shows a step of further etching the fourth glass layer.
Figure 41:
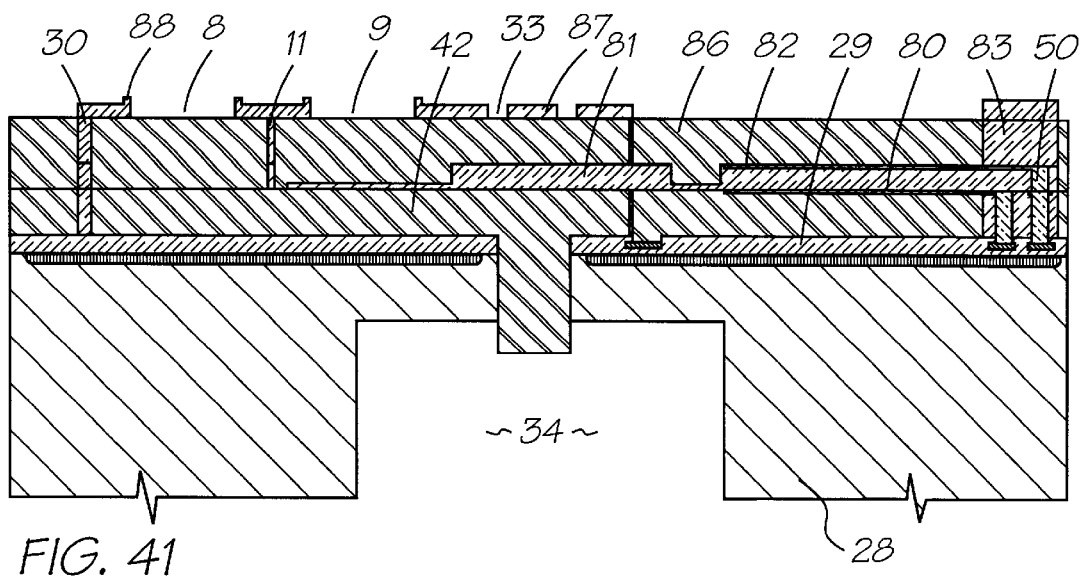
FIG. 41 shows a step of back etching the silicon wafer layer.
Figure 42:
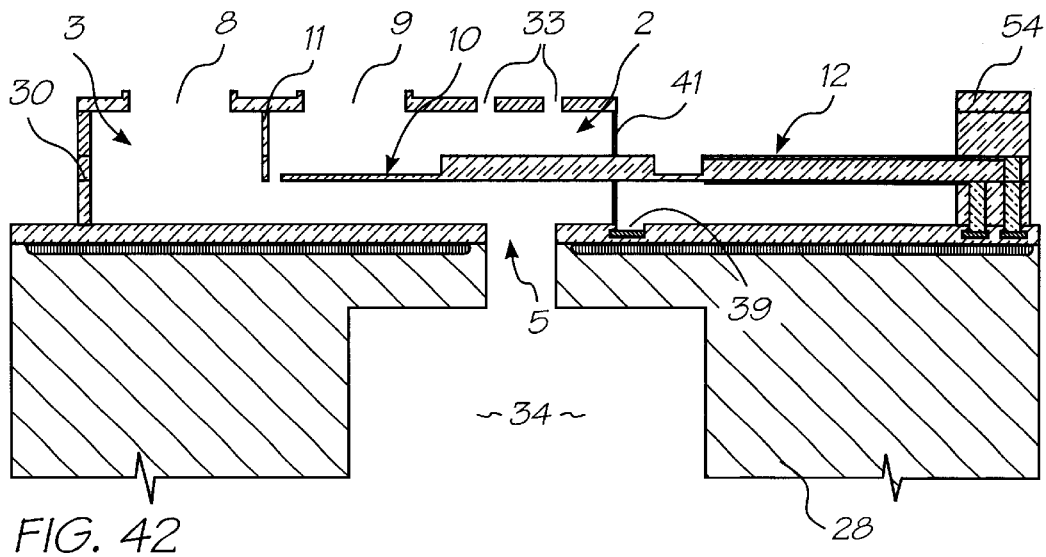
FIG. 42 shows a step of etching the sacrificial material layers.
Figure 43:
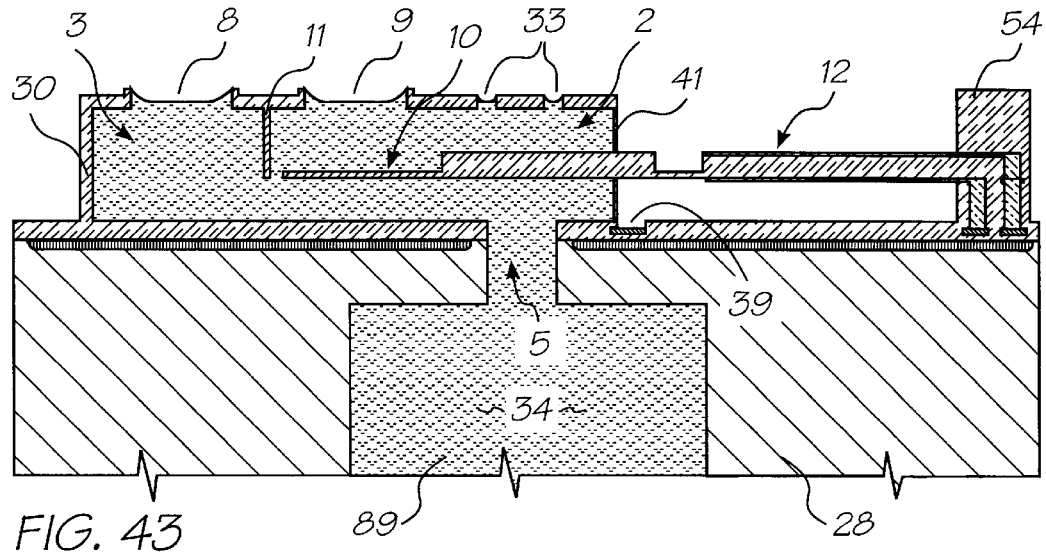
FIG. 43 shows a step of filling the completed ink jet nozzle with ink.

One form of detailed manufacturing process which can be used to fabricate monolithic ink jet printheads operating in accordance with the principles taught by the present embodiment can proceed utilizing the following steps:

1. Using a double sided polished wafer 28, complete drive transistors, data distribution, and timing circuits using a 0.5 micron, one poly, 2 metal CMOS process 29. Relevant features of the wafer at this step are shown in FIG. 27. For clarity, these diagrams may not be to scale, and may not represent a cross section though any single plane of the nozzle. FIG. 26 is a key to representations of various materials in these manufacturing diagrams, and those of other cross referenced ink jet configurations.
2. Etch oxide 29 down to silicon or aluminum using Mask 1. This mask defines the ink inlet hole.
3. Etch silicon to a depth of 15 microns using etched oxide as a mask to form ink supply channel 5. The sidewall slope of this etch is not critical (75 to 90 degrees is acceptable), so standard trench etchers can be used. This step is shown in FIG. 28.
4. Deposit 7 microns of sacrificial aluminum 42.
5. Etch the sacrificial layer 42 using Mask 2, which defines the nozzle walls 30 and actuator anchor 54. This step is shown in FIG. 29.
6. Deposit 7 microns of low stress glass 43 and planarize down to aluminum using CMP.
7. Etch the sacrificial material 42 to a depth of 0.4 microns, and glass 43 to a depth of at least 0.4 microns, using Mask 3. This mask defined the lower heater. This step is shown in FIG. 30.
8. Etch the glass layer 43 down to aluminum using Mask 4, defining heater vias 45,46. This step is shown in FIG. 31.
9. Deposit 1 micron of heater material 80 (e.g. titanium nitride (TiN)) and planarize down to the sacrificial aluminum using CMP. This step is shown in FIG. 32.
10. Deposit 4 microns of low stress glass 81, and etch to a depth of 0.4 microns using Mask 5. This mask defines on upper heater recess. This step is shown in FIG. 33.
11. Etch glass 43 down to TiN using Mask 6. This mask defines the upper heater vias 50.
12. Deposit 1 micron of TIN 82 and planarize down to the glass using CMP. This step is shown-in FIG. 34 and defines upper heater.
13. Deposit 7 microns of low stress glass 83.
14. Etch glass 83 to a depth of 1 micron using Mask 7. This mask defines the nozzle walls 30, nozzle chamber baffle 11, the paddle 10, the flexure, the actuator arm 12, and the actuator anchor 54. This step is shown in FIG. 35.
15. Etch glass 83, as illustrated at 84, to a depth of 3 microns using Mask 8. This mask defines a further part of each of the nozzle walls 30, nozzle chamber baffle 11, the actuator arm 12, and the actuator anchor 54. This step is shown in FIG. 36.
16. Etch glass 83, as illustrated at 85, to a depth of 7 microns using Mask 9. This mask defines final parts of the nozzle walls 30 and the actuator anchor 54. This step is shown in FIG. 37.
17. Deposit 11 microns of sacrificial aluminum 86 and planarize down to glass using CMP. This step is shown in FIG. 38.
18. Deposit 3 microns of PECVD glass 87.
19. Etch glass 87 to a depth of 1 micron using Mask 10, which defines the nozzle rims 88. This step is shown in FIG. 39.
20. Etch glass 87 down to the sacrificial layer 86 (3 microns) using Mask 11, defining the nozzle holes 8 and 9 and the sacrificial etched holes 33, and the nozzle chamber roof. This step is shown in FIG. 40.
21. Wafer probe. All electrical connections are complete at this point, bond pads are accessible, and the chips are not yet separated.
22. Back-etch the silicon wafer 28 to within approximately 10 microns of the front surface using Mask 12. This mask defines the ink inlet 34 which is etched through the wafer 28. The wafer 28 is also diced by this etch. This etch can be achieved with, for example, an ASE Advanced Silicon Etcher from Surface Technology Systems. This step is shown in FIG. 41.
23. Etch all of the sacrificial aluminum 42,86. The nozzle chambers 4 are cleared, the actuators 12 freed, and the chips are separated by this etch. This step is shown in FIG. 42.
24. Mount the printheads in their packaging, which may be a molded plastic former incorporating ink channels which supply the appropriate color ink to the ink inlets at the back of the wafer.
25. Connect the printheads to their interconnect systems. For a low profile connection with minimum disruption of airflow, TAB may be used. Wire bonding may also be used if the printer is to be operated with sufficient clearance to the paper.
26. Hydrophobize the front surface of the printheads.
27. Fill the completed printheads with ink 89 and test them. A filled nozzle is shown in FIG. 43. It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per printhead, but is a major impediment to the fabrication of pagewidth printheads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)
high resolution capability (1,600 dpi or more)
photographic quality output
low manufacturing cost
small size (pagewidth times minimum cross section)
high speed (<2 seconds per page).

All of these features can be met or exceeded by the ink jet systems described below with differing levels of difficulty. Forty-five different ink jet technologies have been developed by the Assignee to give a wide range of choices for high volume manufacture. These technologies form part of separate applications assigned to the present Assignee as set out in the list under the heading Cross References to Related Applications.

The ink jet designs shown here are suitable for a wide range of digital printing systems, from battery powered one-time use digital cameras, through to desktop and network printers, and through to commercial printing systems For ease of manufacture using standard process equipment, the printhead is designed to be a monolithic 0.5 micron CMOS chip with MEMS post processing. For color photographic applications, the printhead is 100 mm long, with a width which depends upon the ink jet type. The smallest printhead designed is covered in U.S. patent application Ser. No. 09/112,764, which is 0.35 mm wide, giving a chip area of 35 square mm. The printheads each contain 19,200 nozzles plus data and control circuitry.

Ink is supplied to the back of the printhead by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The printhead is connected to the camera circuitry by tape automated bonding.

Tables of Drop-on-Demand Ink Jets

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)
Basic operation mode (7 types)
Auxiliary mechanism (8 types)
Actuator amplification or modification method (17 types)
Actuator motion (19 types)
Nozzle refill method (4 types)
Method of restricting back-flow through inlet (10 types)
Nozzle clearing method (9 types)
Nozzle plate construction (9 types)
Drop ejection direction (5 types)
Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. Forty-five such inkjet types were filed simultaneously to the present application.

Other ink jet configurations can readily be derived from these forty-five examples by substituting alternative configurations along one or more of the 11 axes. Most of the forty-five examples can be made into ink jet printheads with characteristics superior to any currently available ink jet technology.

Where there are prior art examples known to the inventor, one or more of these examples are listed in the examples column of the tables below. The simultaneously filed patent applications by the present applicant are listed by USSN numbers. In some cases, a print technology may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| ACTUATOR MECHANISM (APPLIED ONLY TO SELECTED INK DROPS) | | | | |
|---|---|---|---|---|
| | Description | Advantages | Disadvantages | Examples |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the elctrical energy being transformed into kinetic energy of the drop. | Large force generated Simple construction No moving parts Fast operation Small chip area required for actuator | High power Ink carrier limited to water Low efficiency High temperatures required High mechanical stress Unusual materials required Large drive transistors Cavitation causes actuator failure Kogation reduces bubble formation Large print heads are difficult to fabricate | Canon Bubblejet 1979 Endo et al GB patent 2,007,162 Xerox heater-in-pit 1990 Hawkins et al U.S. Pat. No. 4,899,181 Hewlett-Packard TIJ 1982 Vaught et al U.S. Pat. No. 4,490,728 |
| Piezoelectric | A piezoelectric crystal such as lead lanthanum | Low power consumption | Very large area required for actuator | Kyser et al U.S. Pat. No. 3,946,398 |

ACTUATOR MECHANISM (APPLIED ONLY TO SELECTED INK DROPS)

| | Description | Advantages | Disadvantages | Examples |
|---|---|---|---|---|
| | zirconate (PZT) is electrically activated, and either expands, shears, or bends to apply pressure to the ink, ejecting drops. | Many ink types can be used Fast operation High efficiency | Difficult to integrate with electronics High voltage drive transistors required Full pagewidth print heads impractical due to actuator size Requires electrical poling in high field strengths during manufacture | Zoltan U.S. Pat. No. 3,683,212 1973 Stemme U.S. Pat. No. 3,747,120 Epson Stylus Tektronix IJ04 |
| Electrostrictive | An electric field is used to activate electrostriction in relaxor materials such as lead lanthanum zirconate titanate (PLZT) or lead magnesium niobate (PMN). | Low power consumption Many ink types can be used Low thermal expansion Electric field strength required (approx. 3.5 V/$\mu$m) can be generated without difficulty Does not require electrical poling | Low maximum strain (approx. 0.01%) Large area required for actuator due to low strain Response speed is marginal (~10 $\mu$s) High voltage drive transistors required Full pagewidth print heads impractical due to actuator size | Seiko Epson, Usui et all JP 253401/96 IJ04 |
| Ferroelectric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | Low power consumption Many ink types can be used Fast operation (<1 $\mu$s) Relatively high longitudinal strain High efficiency Electric field strength of around 3 V/$\mu$m can be readily provided | Difficult to integrate with electronics Unusual materials such as PLZSnT are required Actuators require a large area | IJ04 |
| Electrostatic plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | Low power consumption Many ink types can be used Fast operation | Difficult to operate electrostatic devices in an aqueous environment The electrostatic actuator will normally need to be separated from the ink Very large area required to achieve high forces High voltage drive transistors may be required Full pagewidth print heads are not competitive due to actuator size | IJ02, IJ04 |
| Electrostatic pull on ink | A strong electric field is applied to the ink, whereupon electrostatic attraction accelerates the ink towards the print medium. | Low current consumption Low temperature | High voltage required May be damaged by sparks due to air breakdown Required field strength increases as the drop size decreases High voltage drive transistors required Electrostatic field attracts dust | 1989 Saito et al, U.S. Pat. No. 4,799,068 1989 Miura et al, U.S. Pat. No. 4,810,954 Tone-jet |
| Permanent magnet electromagnetic | An electromagnet directly attracts a permanent magnet, displacing ink and causing drop ejection. Rare earth magnets with a field strength around 1 Tesla can be | Low power consumption Many ink types can be used Fast operation High efficiency Easy extension from single nozzles to | Complex fabrication Permanent magnetic material such as Neodymium Iron Boron (NdFeB) required. High local currents required | IJ07, IJ10 |

-continued

| ACTUATOR MECHANISM (APPLIED ONLY TO SELECTED INK DROPS) | | | | |
|---|---|---|---|---|
| | Description | Advantages | Disadvantages | Examples |
| | used. Examples are: Samarium Cobalt (SaCo) and magnetic materials in the neodymium iron boron family (NdFeB, NdDyFeBNb, NdDyFeB, etc) | pagewidth print heads | Copper metalization should be used for long electromigration lifetime and low resistivity Pigmented inks are usually infeasible Operating temperature limited to the Curie temperature (around 540 K.) | |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | Low power consumption Many ink types can be used Fast operation High efficiency Easy extension from single nozzles to pagewidth print heads | Complex fabrication Materials not usually present in a CMOS fab such as NiFe, CoNiFe, or CoFe are required High local currents required Copper metalization should be used for long electromigration lifetime and low resistivity Electroplating is required High saturation flux density is required (2.0–2.1 T is achievable with CoNiFe [1]) | IJ01, IJ05, IJ08, IJ10, IJ12, IJ14, IJ15, IJ17 |
| Lorenz force | The Lorenz force acting on a current carrying wire in a magnetic field is utilized. This allows the magnetic field to be supplied externally to the print head, for example with rare earth permanent magnets. Only the current carrying wire need be fabricated on the printhead, simplifying materials requirements. | Low power consumption Many ink types can be used Fast operation High efficiency Easy extension from single nozzles to pagewidth print heads | Force acts as a twisting motion Typically, only a quarter of the solenoid length provides force in a useful direction High local currents required Copper metalization should be used for long electromigration lifetime and low resistivity Pigmented inks are usually infeasible | IJ06, IJ11, IJ13, IJ16 |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | Many ink types can be used Fast operation Easy extension from single nozzles to pagewidth print heads High force is available | Force acts as a twisting motion Unusual materials such as Terfenol-D are required High local currents required Copper metalization should be used for long electromigration lifetime and low resistivity Pre-stressing may be required | Fischenbeck, U.S. Pat. No. 4,032,929 IJ25 |
| Surface tension reduction | Ink under positive pressure is held in a nozzle by surface tension. The surface tension of the ink is reduced below the bubble threshold, causing the ink to egress from the nozzle. | Low power consumption Simple construction No unusual materials required in fabrication High efficiency Easy extension from single nozzles to pagewidth print heads | Requires supplementary force to effect drop separation Requires special ink surfactants Speed may be limited by surfactant properties | Silverbrook, EP 0771 658 A2 and related patent applications |
| Viscosity reduction | The ink viscosity is locally reduced to select which drops are to be ejected. A viscosity reduction can be achieved electro- | Simple construction No unusual materials required in fabrication Easy extension from single nozzles to page-width print heads | Requires supplementary force to effect drop separation Requires special ink viscosity properties High speed is difficult | Silverbrook, EP 0771 658 A2 and related patent applications |

-continued

ACTUATOR MECHANISM (APPLIED ONLY TO SELECTED INK DROPS)

| | Description | Advantages | Disadvantages | Examples |
|---|---|---|---|---|
| | thermally with most inks, but special inks can be engineered for a 100:1 viscosity reduction. | | to achieve Requires oscillating ink pressure A high temperature difference (typically 80 degrees) is required | |
| Acoustic | An acoustic wave is generated anf focussed upon the drop ejection region. | Can operate without a nozzle plate | Complex drive circuitry Complex fabrication Low efficiency Poor control of drop position Poor control of drop volume | 1993 Hadimioglu et al, EUP 550,192 1993 Elrod et al, EUP 572,220 |
| Thermoelastic bend actuator | An actuator which relies upon differential thermal expansion upon Joule heating is used. | Low power consumption Many ink types can be used Simple planar fabrication Small chip area required for each actuator Fast operation High efficiency CMOS compatible voltages and currents Standard MEMS processes can be used Easy extension from single nozzles to pagewidth print heads | Efficient aqueous operation requires a thermal insulator on the hot side Corrosion prevention can be difficult Pigmented inks may be infeasible, as pigment particles may jam the bend actuator | IJ03, IJ09, IJ17, IJ18, IJ19, IJ20, IJ21, IJ22, IJ23, IJ24, IJ27, IJ28, IJ29, IJ30, IJ31, IJ32, IJ33, IJ34, IJ35, IJ36, IJ37, IJ38, IJ39, IJ40, IJ41 |
| High CTE thermoelastic actuator | A material with a very high coefficient of thermal expansion (CTE) such as polytetrafluoroethylene (PTFE) is used. As high CTE materials are usually non-conductive, a heater fabricated from a conductive material is incorporated. A 50 $\mu$m long PTFE bend actuator with polysilicon heater and 15 mW power input can provide 180 $\mu$N force and 10 $\mu$m deflection. Actuator motions include: Bend Push Buckle Rotate | High force can be generated Three methods of PTFE deposition are under development: chemical vapor deposition (CVD), spin coating, and evaporation PTFE is a candidate for low dielectric constant insulation in ULSI Very low power consumption Many ink types can be used Simple planar fabrication Small chip area required for each actuator Fast operation High efficiency CMOS compatible voltages and currents Easy extension from single nozzles to pagewidth print heads | Requires special material (e.g. PTFE) Requires a PTFE deposition process, which is not yet standard in ULSI fabs PTFE deposition cannot be followed with high temperature (above 350° C.) processing Pigmented inks may be infeasible, as pigment particles may jam the bend actuator | IJ09, IJ17, IJ18, IJ20, IJ21, IJ22, IJ23, IJ24, IJ27, IJ28, IJ29, IJ30, IJ31, IJ42, IJ43, IJ44 |
| Conductive polymer thermoelastic actuator | A polymer with a high coefficient of thermal expansion (such as PTFE) is doped with conducting substances to increase its conductivity to about 3 orders of magnitude below that of copper. The conducting polymer expands when resistively heated. Examples of conducting dopants include: | High force can be generated Very low power consumption Many ink types can be used Simple planar fabrication Small chip area required for each actuator Fast operation High efficiency CMOS compatible | Requires special materials development (High CTE conductive polymer) Requires a PTFE deposition process, which is not yet standard in ULSI fabs PTFE deposition cannot be followed with high temperature (above 350° C.) processing Evaporation and CVD | IJ24 |

ACTUATOR MECHANISM (APPLIED ONLY TO SELECTED INK DROPS)

|  | Description | Advantages | Disadvantages | Examples |
|---|---|---|---|---|
|  | Carbon nanotubes Metal fibers Conductive polymers such as doped poly-thiophene Carbon granules | voltages and currents Easy extension from single nozzles to pagewidth print heads | deposition techniques cannot be used Pigmented inks may be infeasible, as pigment particles may jam the bend actuator |  |
| Shape memory alloy | A shape memory alloy such as TiNi (also known as Nitinol-Nickel Titanium alloy developed at the Naval Ordnance Laboratory) is thermally switched between its weak martensitic state and its high stiffness austeic state. The shape of the actuator in its martensitic state is deformed relative to the austenic shape. The shape change causes ejection of a drop. | High force is available (stresses of hundreds of MPa) Large strain is available (more than 3%) High corrosion resistance Simple construction Easy extension from single nozzles to pagewidth print heads Low voltage operation | Fatigue limits maximum number of cycles Low strain (1%) is required to extend fatigue resistance Cycle rate limited by heat removal Requires unusual materials (TiNi) The latent heat of transformation must be provided High current operation Requires prestressing to distort the martensitic state | IJ26 |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | Linear Magnetic actuators can be constructed with high thrust, long travel, and high efficiency using planar semi-conductor fabrication techniques Long actuator travel is available Medium force is available Low voltage operation | Requires unusual semiconductor materials such as soft magnetic alloys (e.g. CoNiFe) Some varieties also require permanent magnetic materials such as Neodymium iron boron (NdFeB) Requires complex multi-phase drive circuitry High current operation | IJ12 |

BASIC OPERATION MODE

|  | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient velocity to overcome the surface tension. | Simple operation No external fields required Satellite drops can be avoided if drop velocity is less than 4 m/s Can be efficient, depending upon the actuator used | Drop repetition rate is usually limited to around 10 kHz. However, this is not fundamental to the method, but is related to the refill method normally used All of the drop kinetic energy must be provided by the actuator Satellite drops usually form if drop velocity is greater than 4.5 m/s | Thermal ink jet Thermal ink jet Piezoelectric ink jet IJ01, IJ02, IJ03, IJ04, IJ05, IJ06, IJ07, IJ09, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | Very simple print head fabrication can be used The drop selection means does not need to provide the energy required to separate the drop from the nozzle | Requires close proximity between the print head and the print media or transfer roller May require two print heads printing alternate rows of the image Monolithic color print heads are difficult | Silverbrook, ESP 0771 658 A2 and related patent applications |

-continued

BASIC OPERATION MODE

| | Description | Advantages | Disadvantages | Examples |
|---|---|---|---|---|
| Electrostatic pull on ink | The drops to be printed are selected by some manner (e.g. thermally induced surface tension reduction of pressurized ink). Selected drops are separated from the ink in the nozzle by a strong electric field. | Very simple print head fabrication can be used The drop selection means does not need to provide the energy required to separate the drop from the nozzle | Requires very high electrostatic field Electrostatic field for small nozzle sizes is above air breakdown Electrostatic field may attract dust | Silverbrook, EP 0771 658 A2 and related patent applications Tone-Jet |
| Magnetic pull on ink | The drops to be printed are selected by some manner (e.g. thermally induced surface tension reduction of pressurized ink). Selected drops are separated from the ink in the nozzle by a strong magnetic field acting on the magnetic ink. | Very simple print head fabrication can be used The drop selection means does not need to provide the energy required to separate the drop from the nozzle | Requires magnetic ink Ink colors other than black are difficult Requires very high magnetic fields | Silverbrook, EP 0771 658 A2 and related patent applications |
| Shutter | The actuator moves a shutter to block ink flow to the nozzle. The ink pressure is pulsed at a multiple of the drop ejection frequency. | High speed (>50 kHz) operation can be achieved due to reduced refill time Drop timing can be very accurate The actuator energy can be very low | Moving parts are required Requires ink pressure modulator Friction and wear must be considered Stiction is possible | IJ13, IJ17, IJ21 |
| Shuttered grill | The actuator moves a shutter to block ink flow through a grill to the nozzle. The shutter movement need only be equal to the width of the grill holes. | Actuators with small travel can be used Actuators with small force can be used High speed (>50 kHz) operation can be achieved | Moving parts are required Requires ink pressure modulator Friction and wear must be considered Stiction is possible | IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | Extremely low energy opeation is possible No heat dissipation problems | Requires an external pulsed magnetic field Requires special materials for both the actuator and the ink pusher Complex construction | IJ10 |

AUXILIARY MECHANISM (APPLIED TO ALL NOZZLES)

| | Description | Advantages | Disadvantages | Examples |
|---|---|---|---|---|
| None | The actuator directly fires the ink drop, and there is no external field or other mechanism required. | Simplicity of construction Simplicity of operation Small physical size | Drop ejection energy must be supplied by individual nozzle actuator | Most ink jets, including piezoelectric and thermal bubble. IJ01, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Oscillating ink pressure (including acoustic stimulation) | The ink pressure oscillates, providing much of the drop ejection energy. The actuator selectes which drops are to be fired by selectively blocking | Oscillating ink pressure can provide a refill pulse, allowing higher operating speed The actuators may operate with much lower energy | Requires external ink pressure oscillator Ink pressure phase and amplitude must be carefully controlled Acoustic reflections in the ink chamber | Silverbrook, EP 0771 658 A2 and related patent applications IJ08, IJ13, IJ15, IJ17, IJ18, IJ19, IJ21 |

-continued

AUXILIARY MECHANISM (APPLIED TO ALL NOZZLES)

| | Description | Advantages | Disadvantages | Examples |
|---|---|---|---|---|
| | or enabling nozzles. The ink pressure oscillation may be achieved by vibrating the print head, or preferably by an actuator in the ink supply. | Acoustic lenses can be used to focus the sound on the nozzles | must be designed for | |
| Media proximity | The print head is placed in close proximity to the print medium. Selected drops protrude from the print head further than unselected drops, and contact the print medium. The drop soaks into the medium fast enough to cause drop separation. | Low power High accuracy Simple print head construction | Precision assembly required Paper fibers may cause problems Cannot print on rough substrates | Silverbrook, EP 0771 658 A2 and related patent applications |
| Transfer roller | Drops are printed to a transfer roller instead of straight to the print medium. A transfer roller can also be used for proximity drop separation. | High accuracy Wide range of print substrates can be used Ink can be dried on the transfer roller | Bulky Expensive Complex construction | Silverbrook, EP 0771 658 A2 and related patent applications Tektronix hot melt piezoelectric ink jet Any of the IJ series |
| Electrostatic | An electric field is used to accelerate selected drops towards the print medium. | Low power Simple print head construction | Field strength required for separation of small drops is near or above air breakdown | Silverbrook, ESP 0771 658 A2 and related patent applications Tone-Jet |
| Direct magnetic field | A magnetic field is used to accelerate selected drops of magnetic ink towards the print medium. | Low power Simple print head construction | Requires magnetic ink Requires strong magnetic field | Silverbrook, ESP 0771 658 A2 and related patent applications |
| Cross magnetic field | The print head is placed in a constant magnetic field. The Lorenz force in a current carrying wire is used to move the actuator. | Does not require magnetic materials to be integrated in the print head manufacturing process | Requires external magnet Current densities may be high, resulting in electromigration problems | IJ06, IJ16 |
| Pulsed magnetic field | A pulsed magnetic field is used to cyclically attract a paddle, which pushes on the ink. A small actuator moves a catch, which selectively prevents the paddle from moving. | Very low power operation is possible Small print head size | Complex print head construction Magnetic materials required in print head | IJ10 |

ACTUATOR AMPLIFICATION OR MODIFICATION METHOD

| | Description | Advantages | Disadvantages | Examples |
|---|---|---|---|---|
| None | No actuator mechanical amplification is used. The actuator directly drives the drop ejection process. | Operational simplicity | Many actuator mechanisms have insufficient travel, or insufficient force, to efficiently drive the drop ejection process | Thermal Bubble Ink jet IJ01, IJ02, IJ06, IJ07, IJ16, IJ25, IJ26 |
| Differential expansion bend actuator | An actuator material expands more on one side than on the other. The expansion may be thermal, piezoelectric, | Provides greater travel in a reduced print head area | High stresses are involved Care must be taken that the materials do not | Piezoelectric IJ03, IJ09, IJ17, IJ18, IJ19, IJ20, IJ21, IJ22, IJ23, IJ24, IJ27, IJ29, |

-continued

ACTUATOR AMPLIFICATION OR MODIFICATION METHOD

| | Description | Advantages | Disadvantages | Examples |
|---|---|---|---|---|
| | magnetostrictive, or other mechanism. The bend actuator converts a high force low travel actuator mechanism to high travel, lower force mechanism. | | delaminate Residual bend resulting from high temperature or high stress during formation | IJ30, IJ31, IJ32, IJ33, IJ34, IJ35, IJ36, IJ37, IJ38, IJ39, IJ42, IJ43, IJ44 |
| Transient bend actuator | A trilayer bend actuator where the two outside layers are identical. This cancels bend due to ambient temperature and residual stress. The actuator only responds to transient heating of one side or the other. | Very good temperature stability High speed, as a new drop can be fired before heat dissipates Cancels residual stress of formation | High stresses are involved Care must be taken that the materials do not delaminate | IJ40, IJ41 |
| Reverse spring | The actuator loads a spring. When the actuator is turned off, the spring releases. This can reverse the force/distance curve of the actuator to make it compatible with the force/time requirements of the drop ejection. | Better coupling to the ink | Fabrication complexity High stress in the spring | IJ05, IJ11 |
| Actuator stack | A series of thin actuators are stacked. This can be appropriate where actuators require high electric field strength, such as electrostatic and piezoelectric actuators. | Increased travel Reduced drive voltage | Increased fabrication complexity Increased possibility of short circuits due to pinholes | Some piezoelectric ink jets IJ04 |
| Multiple actuators | Multiple smaller actuators are used simultaneously to move the ink. Each actuator need provide only a portion of the force required. | Increases the force available from an actuator Multiple actuators can be positioned to control ink flow accurately | Actuator forces may not add linearly, reducing efficiency | IJ12, IJ13, IJ18, IJ20, IJ22, IJ28, IJ42, IJ43 |
| Linear Spring | A linear spring is used to transform a motion with small travel and high force into a longer travel, lower force motion. | Matches low travel actuator with higher travel requirements Non-contact method of motion transformation | Requires print head area for the spring | IJ15 |
| Coiled actuator | A bend actuator is coiled to provide greater travel in a reduced chip area. | Increases travel Reduces chip area Planar implementations are relatively easy to fabricate. | Generally restricted to planar implementations due to extreme fabrication difficulty in other orientations. | IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | Simple means of increasing travel of a bend actuator | Care must be taken not to exceed the elastic limit in the flexure area Stress distribution is very uneven Difficult to accurately model with finite element analysis | IJ10, IJ19, IJ33 |
| Catch | The actuator controls a small catch. The catch either enables or disables movement of | Very low actuator energy Very small actuator size | Complex construction Requires external force | IJ10 |

-continued

ACTUATOR AMPLIFICATION OR MODIFICATION METHOD

| | Description | Advantages | Disadvantages | Examples |
|---|---|---|---|---|
| | an ink pusher that is controlled in a bulk manner. | | Unsuitable for pigmented inks | |
| Gears | Gears can be used to increase travel at the expense of duration. Circular gears, rack and pinion, ratchets, and other gearing, methods can be used. | Low force, low travel actuators can be used Can be fabricated using standard surface MEMS processes | Moving parts are required Several actuator cycles are required More complex drive electronics Complex construction Friction, friction, and wear are possible | IJ13 |
| Buckle plate | A buckle plate can be used to change a slow actuator into a fast motion. It can also convert a high force, low travel actuator into a high travel, medium force motion. | Very fast movement achievable | Must stay within elastic limits of the materials for long device life High stresses involved Generally high power requirement | S. Hirata et al, "An Ink-jet Head Using Diaphragm Microactuator", Proc. IEEE MEMS, Feb. 1996, pp 418–423. IJ18, IJ27 |
| Tapered magnetic pole | A tapered magnetic pole can increase travel at the expense of force. | Linearizes the magnetic force/distance curve | Complex construction | IJ14 |
| Lever | A lever and fulcrum is used to transform a motion with small travel and high force into a motion with longer travel and lower force. The lever can also reverse the direction of travel. | Matches low travel actuator with higher travel requirements Fulcrum area has no linear movement, and can be used for a fluid seal | High stress around the fulcrum | IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | High mechanical advantage The ratio of force to travel of the actuator can be matched to the nozzle requirements by varying the number of impeller vanes | Complex construction Unsuitable for pigmented inks | IJ28 |
| Acoustic lens | A refractive or diffractive (e.g. zone plate) acoustic lens is used to concentrate sound waves. | No moving parts | Large area required Only relevant for acoustic ink jets | 1993 Hadimioglu et al, EUP 550,192 1993 Elrod et al, EUP 572,220 |
| Sharp conductive point | A sharp point is used to concentrate an electrostatic field. | Simple construction | Difficult to fabricate using standard VLSI processes for a surface ejecting ink-jet Only relevant for electrostatic ink jets | Tone-jet |

ACTUATOR MOTION

| | Description | Advantages | Disadvantages | Examples |
|---|---|---|---|---|
| Volume expansion | The volume of the actuator changes, pushing the ink in all directions. | Simple construction in the case of thermal ink jet | High energy is typically required to achieve volume expansion. This leads to thermal stress, cavitation, and kogation in | Hewlett-Packard Thermal Ink jet Canon Bubblejet |

-continued

ACTUATOR MOTION

| | Description | Advantages | Disadvantages | Examples |
|---|---|---|---|---|
| Linear, normal to chip surface | The actuator moves in a direction normal to the print head surface. The nozzle is typically in the line of movement. | Efficient coupling to ink drops ejected normal to the surface | thermal ink jet implementations High fabrication complexity may be required to achieve perpendicular motion | IJ01, IJ02, IJ04, IJ07, IJ11, IJ14 |
| Parallel to chip surface | The actuator moves parallel to the print head surface. Drop ejection may still be normal to the surface. | Suitable for planar fabrication | Fabrication complexity Friction Stiction | IJ12, IJ13, IJ15, IJ33,, IJ34, IJ35, IJ36 |
| Membrane push | An actuator with a high force but small area is used to push a stiff membrane that is in contact with the ink. | The effective area of the actuator becomes the membrane area | Fabrication complexity Actuator size Difficulty of integration in a VLSI process | 1982 Howkins U.S. Pat. No. 4,459,601 |
| Rotary | The actuator causes the rotation of some element, such a grill or impeller | Rotary levers may be used to increase travel Small chip area requirements | Device complexity May have friction at a pivot point | IJ05, IJ08, IJ13, IJ28 |
| Bend | The actuator bends when energized. This may be due to differential thermal expansion, piezoelectric expansion, magnetostriction, or other form of relative dimensional change. | A very small change in dimensions can be converted to a large motion. | Requires the actuator to be made from at least two distinct layers, or to have a thermal difference across the actuator | 1970 Kyser et al U.S. Pat. No. 3,946,398 1973 Stemme U.S. Pat. No. 3,747,120 IJ03, IJ09, IJ10, IJ19, IJ23, IJ24, IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | Allows operation where the net linear force on the paddle is zero Small chip area requirements | Inefficient coupling to the ink motion | IJ06 |
| Straighten | The actuator is normally bent, and straightens when energized. | Can be used with shape memory alloys where the austenic phase is planar | Requires careful balance of stresses to ensure that the quiescent bend is accurate | IJ26, IJ32 |
| Double bend | The actuator bends in one direction when one element is energized, and bends the other way when another element is energized. | One actuator can be used to power two nozzles. Reduced chip size. Not sensitive to ambient temperature | Difficult to make the drops ejected by both bend directions identical. A small efficiency loss compared to equivalent single bend actuators. | IJ36, IJ37, IJ38 |
| Shear | Energizing the actuator causes a shear motion in the actuator material. | Can increase the effective travel of piezoelectric actuators. | Not readily applicable to other actuator mechanisms | 1985 Fishbeck U.S. Pat. No. 4,584,590 |
| Radial constriction | The actuator squeezes an ink reservoir, forcing ink from a constricted nozzle. | Relatively easy to fabricate single nozzles from glass tubing as macroscopic structures | High force required Inefficient Difficult to integrate with VLSI processes | 1970 Zoltan U.S. Pat. No. 3,683,212 |
| Coil/uncoil | A coiled actuator uncoils or coils more tightly. The motion of the free end of the actuator ejects the ink. | Easy to fabricate as a planar VLSI process Small area required, therefore low cost | Difficult to fabricate for non-planar devices Poor out-of-plane stiffness | IJ17, IJ21, IJ34, IJ35 |
| Bow | The actuator bows (or buckles) in the middle when energized. | Can increase the speed of travel Mechanically | Maximum travel is constrained High force | IJ16, IJ18, IJ27 |

-continued

ACTUATOR MOTION

| | Description | Advantages | Disadvantages | Examples |
|---|---|---|---|---|
| Push-Pull | Two actuators control a shutter. One actuator pulls the shutter, and the other pushes it. | rigid The structure is pinned at both ends, so has a high out-of-plane rigidity | required Not readily suitable for ink jets which directly push the ink | IJ18 |
| Curl inwards | A set of actuators curl inwards to reduce the volume of ink that they enclose. | Good fluid flow to the region behind the actuator increases efficiency | Design complexity | IJ20, IJ42 |
| Curl outwards | A set of actuators curl outwards, pressurizing ink in a chamber surrounding the actuators, and expelling ink from a nozzle in the chamber. | Relatively simple construction | Relatively large chip area | IJ43 |
| Iris | Multiple vanes enclose a volume of ink. These simultaneously rotate, reducing the volume between the vanes. | High efficiency Small chip area | High fabrication complexity Not suitable for pigmented inks | IJ22 |
| Acoustic vibration | The actuator vibrates at a high frequency. | The actuator can be physically distant from the ink | Large area required for efficient operation at useful frequencies Acoustic coupling and crosstalk Complex drive circuitry Poor control of drop volume and position | 1993 Hadimioglu et al, EUP 550,192 1993 Elrod et al, EUP 572,220 |
| None | In various ink jet designs the actuator does not move. | No moving parts | Various other tradeoffs are required to eliminate moving parts | Silverbrook, EP 0771 658 A2 and related patent applications Tone-jet |

NOZZLE REFILL METHOD

| | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle. | Fabrication simplicity Operational simplicity | Low speed Surface tension force relatively small compared to actuator force Long refill time usually dominates the total repetition rate | Thermal ink jet Piezoelectric ink jet IJ01–IJ07, IJ10– IJ14, IJ16, IJ20, IJ22–IJ45 |
| Shuttered oscillating ink pressure | Ink to the nozzle chamber is provided at a pressure that oscillates at twice the drop ejection frequency. When a drop is to be ejected, the shutter is opened for 3 half cycles: drop ejection, actuator return, and refill. The | High speed Low actuator energy, as the actuator need only open or close the shutter, instead of ejecting the ink drop | Requires common ink pressure oscillator May not be suitable for pigmented inks | IJ08, IJ13, IJ15, IJ17, IJ18, IJ19, IJ21 |

-continued

NOZZLE REFILL METHOD

| | Description | Advantages | Disadvantages | Examples |
|---|---|---|---|---|
| | shutter is then closed to prevent the nozzle chamber emptying during the next negative pressure cycle. | | | |
| Refill actuator | After the main actuator has ejected a drop a second (refill) actuator is energized. The refill actuator pushes ink into the nozzle chamber. The refill actuator returns slowly, to prevent its return from emptying the chamber again. | High speed, as the nozzle is actively refilled | Requires two independent actuators per nozzle | IJ09 |
| Positive ink pressure | The ink is held a slight positive pressure. After the ink drop is ejected, the nozzle chamber fills quickly as surface tension and ink pressure both operate to refill the nozzle. | High refill rate, therefore a high drop repetition rate is possible | Surface spill must be prevented Highly hydrophobic print head surfaces are required | Silverbrook, EP 0771 658 A2 and related patent applications Alternative for:, IJ01–IJ07, IJ10–IJ14, IJ16, IJ20, IJ22–IJ45 |

METHOD OF RESTRICTING BACK-FLOW THROUGH INLET

| | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | Design simplicity Operational simplicity Reduces crosstalk | Restricts refill rate May result in a relatively large chip area Only partially effective | Thermal ink jet Piezoelectric ink jet IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | Drop selection and separation forces can be reduced Fast refill time | Requires a method (such as a nozzle rim or effective hydrophobizing, or both) to prevent flooding of the ejection surface of the print head. | Silverbrook, EP 0771 658 A2 and related patent applications Possible operation of the following: IJ01–IJ07, IJ09–IJ12, IJ14, IJ16, IJ20, IJ22, IJ23–IJ34, IJ36–IJ41, IJ44 |
| Baffle | One or more baffles are placed in the inlet ink flow. When the actuator is energized, the rapid ink movement creates eddies which restrict the flow through the inlet. The slower refill process is unrestricted, and does not result in eddies. | The refill rate is not as restricted as the long inlet method. Reduces crosstalk | Design complexity May increase fabrication complexity (e.g. Tektronix hot melt Piezoelectric print heads). | HP Thermal Ink Jet Tektronix piezoelectric ink jet |
| Flexible flap restricts inlet | In this method recently disclosed by Canon, the expanding actuator (bubble) pushes on a | Significantly reduces back-flow for edge-shooter thermal ink jet | Not applicable to most ink jet configurations Increased | Canon |

-continued

METHOD OF RESTRICTING BACK-FLOW THROUGH INLET

| | Description | Advantages | Disadvantages | Examples |
|---|---|---|---|---|
| | flexible flap that restricts the inlet. | devices | fabrication complexity Inelastic deformation of polymer flap results in creep over extended use | |
| Inlet filter | A filter is located between the ink inlet and the nozzle chamber. The filter has a multitude of small holes or slots, restricting ink flow. The filter also removes particles which may block the nozzle. | Additional advantage of ink filtration Ink filter may be fabricated with no additional process steps | Restricts refill rate May result in complex construction | IJ04, IJ12, IJ24, IJ27, IJ29, IJ30 |
| Small inlet compared to nozzle | The ink inlet channel to the nozzle chamber has a substantially smaller cross section than that of the nozzle, resulting in easier ink egress out of the nozzle than out of the inlet. | Design simplicity | Restricts refill rate May result in a relatively large chip area Only partially effective | IJ02, IJ37, IJ44 |
| Inlet shutter | A secondary actuator controls the position of a shutter, closing off the ink inlet when the main actuator is energized. | Increases speed of the ink-jet print head operation | Requires separate refill actuator and drive circuit | IJ09 |
| The inlet is located behind the ink-pushing surface | The method avoids the problem of inlet back-flow by arranging the ink-pushing surface of the actuator between the inlet and the nozzle. | Back-flow problem is eliminated | Requires careful design to minimize the negative pressure behind the paddle | IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | Significant reductions in back-flow can be achieved Compact designs possible | Small increase in fabrication complexity | IJ07, IJ20, IJ26, IJ38 |
| Nozzle actuator does not result in ink back-flow | In some configurations of ink jet, there is no expansion or movement of an actuator which may cause ink back-flow through the inlet. | Ink back-flow problem is eliminated | None related to ink back-flow on actuation | Silverbrook, EP 0771 658 A2 and related patent applications Valve-jet Tone-jet |

NOZZLE CLEARING METHOD

| | Description | Advantages | Disadvantages | Examples |
|---|---|---|---|---|
| Normal nozzle firing | All of the nozzles are fired periodically, before the ink has a chance to dry. When not in use the nozzles are sealed (capped) against air. The nozzle firing is usually performed during a special clearing cycle, after first moving the print | No added complexity on the print head | May not be sufficient to displace dried ink | Most ink jet systems IJ01, IJ02, IJ03, IJ04, IJ05, IJ06, IJ07, IJ09, IJ10, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, |

-continued

NOZZLE CLEARING METHOD

| | Description | Advantages | Disadvantages | Examples |
|---|---|---|---|---|
| | head to a cleaning station. | | | IJ39, IJ40,, IJ41, IJ42, IJ43, IJ44,, IJ45 |
| Extra power to ink heater | In systems which heat the ink, but do not boil it under normal situations, nozzle clearing can be achieved by over-powering the heater and boiling ink at the nozzle. | Can be highly effective if the heater is adjacent to the nozzle | Requires higher drive voltage for clearing May require larger drive transistors | Silverbrook, EP 0771 658 A2 and related patent applications |
| Rapid success-ion of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | Does not require extra drive circuits on the print head Can be readily controlled and initiated by digital logic | Effectiveness depends substantially upon the configuration of the ink jet nozzle | May be used with: IJ01, IJ02, IJ03, IJ04, IJ05, IJ06, IJ07, IJ09, IJ10, IJ11, IJ14, IJ16, IJ20, IJ22, IJ23, IJ24, IJ25, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink pushing actuator | Where an actuator is not normally driven to the limit of its motion, nozzle clearing may be assisted by providing an enhanced drive signal to the actuator. | A simple solution where applicable | Not suitable where there is a hard limit to actuator movement | May be used with: IJ03, IJ09, IJ16, IJ20, IJ23, IJ24, IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | A high nozzle clearing capability can be achieved May be implemented at very low cost in systems which already include acoustic actuators | High implementation cost if system does not already include an acoustic actuator | IJ08, IJ13, IJ15, IJ17, IJ18, IJ19, IJ21 |
| Nozzle clearing plate | A microfabricated plate is pushed against the nozzles. The plate has a post for every nozzle. A post moves through each nozzle, displacing dried ink. | Can clear severely clogged nozzles | Accurate mechanical alignment is required Moving parts are required There is risk of damage to the nozzles Accurate fabrication is required | Silverbrook, EP 0771 658 A2 and related patent applications |
| Ink pressure pulse | The pressure of the ink is temporarily increased so that ink streams from all of the nozzles. This may be used in conjunction with actuator energizing. | May be effective where other methods cannot be used | Requires pressure pump or other pressure actuator Expensive Wasteful of ink | May be used with all IJ series ink jets |
| Print head wiper | A flexible 'blade' is wiped across the print head surface. The blade is usually fabricated from a flexible polymer, e.g. rubber or synthetic elastomer. | Effective for planar print head surfaces Low cost | Difficult to use if print head surface is non-planar or very fragile Requires mechanical parts Blade can wear out in high volume | Many ink jet systems |

-continued

NOZZLE CLEARING METHOD

| | Description | Advantages | Disadvantages | Examples |
|---|---|---|---|---|
| Separate ink boiling heater | A separate heater is provided at the nozzle although the normal drop e-ection mechanism does not require it. The heaters do not require individual drive circuits, as many nozzles can be cleared simultaneously, and no imaging is required. | Can be effective where other nozzle clearing methods cannot be used Can be implemented at no additional cost in some ink jet configurations | print systems Fabrication complexity | Can be used with many IJ series ink jets |

NOZZLE PLATE CONSTRUCTION

| | Description | Advantages | Disadvantages | Examples |
|---|---|---|---|---|
| Electro-formed nickel | A nozzle plate is separately fabricated from electroformed nickel, and bonded to the print head chip. | Fabrication simplicity | High temperatures and pressures are required to bond nozzle plate Minimum thickness constraints Differential thermal expansion | Hewlett Packard Thermal Ink jet |
| Laser ablated or drilled polymer | Individual nozzle holes are ablated by an intense UV laser in a nozzle plate, which is typically a polymer such as polyimide or polysulphone | No masks required Can be quite fast Some control over nozzle profile is possible Equipment required is relatively low cost | Each hole must be individually formed Special equipment required Slow where there are many thousands of nozzles per print head May produce thin burrs at exit holes | Canon Bubblejet 1988 Sercel et al., SPIE, Vol. 998 Excimer Beam Applications, pp. 76–83 1993 Watanabe et al., U.S. Pat. No. 5,208,604 |
| Silicon micro-machined | A separate nozzle plate is micromachined from single crystal silicon, and bonded to the print head wafer. | High accuracy is attainable | Two part construction High cost Requires precision alignment Nozzles may be clogged by adhesive | K. Bean, IEEE Transactions on Electron Devices, Vol. ED-25, No. 10, 1978, pp 1185–1195 Xerox 1990 Hawkins et al., U.S. Pat. No. 4,899,181 |
| Glass capillaries | Fine glass capillaries are drawn from glass tubing. This method has been used for making individual nozzles, but is difficult to use for bulk manufacturing of print heads with thousands of nozzles. | No expensive equipment required Simple to make single nozzles | Very small nozzle sizes are difficult to form Not suited for mass production | 1970 Zoltan U.S. Pat. No. 3,683,212 |
| Monolithic, surface micro-machined using VLSI litho-graphic processes | The nozzle plate is deposited as a layer using standard VLSI deposition techniques. Nozzles are etched in the nozzle plate using VLSI lithography and etching. | High accuracy (<1 $\mu$m) Monolithic Low cost Existing processes can be used | Requires sacrificial layer under the nozzle plate to form the nozzle chamber Surface may be fragile to the touch | Silverbrook, EP 0771 658 A2 and related patent applications IJ01, IJ02, IJ04, IJ11, IJ12, IJ17, IJ18, IJ20, IJ22, IJ24, IJ27, IJ28, IJ29, IJ30, IJ31, IJ32, IJ33, IJ34, IJ36, IJ37, IJ38, IJ39, IJ40, IJ41, IJ42, IJ43, IJ44 |

NOZZLE PLATE CONSTRUCTION

| | Description | Advantages | Disadvantages | Examples |
|---|---|---|---|---|
| Monolithic, etched through substrate | The nozzle plate is a buried etch stop in the wafer. Nozzle chambers are etched in the front of the wafer, and the wafer is thinned from the back side. Nozzles are then etched in the etch stop layer. | High accuracy (<1 $\mu$m) Monolithic Low cost No differential expansion | Requires long etch times Requires a support wafer | IJ03, IJ05, IJ06, IJ07, IJ08, IJ09, IJ10, IJ13, IJ14, IJ15, IJ16, IJ19, IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | No nozzles to become clogged | Difficult to control drop position accurately Crosstalk problems | Ricoh 1995 Sekiya et al U.S. Pat. No. 5,412,413 1993 Hadimioglu et al EUP 550,192 1993 Elrod et al EUP 572,220 |
| Trough | Each drop ejector has a trough through which a paddle moves. There is no nozzle plate. | Reduced manufacturing complexity Monolithic | Drop firing direction is sensitive to wicking. | IJ35 |
| Nozzle slit instead of individual nozzles | The elimination of nozzle holes and replacement by a slit encompassing many actuator positions reduces nozzle clogging, but increases crosstalk due to ink surface waves | No nozzles to become clogged | Difficult to control drop position accurately Crosstalk problems | 1989 Saito et al U.S. Pat. No. 4,799,068 |

DROP EJECTION DIRECTION

| | Description | Advantages | Disadvantages | Examples |
|---|---|---|---|---|
| Edge ('edge shooter') | Ink flow is along the surface of the chip, and ink drops are ejected from the chip edge. | Simple construction No silicon etching required Good heat sinking via substrate Mechanically strong Ease of chip handing | Nozzles limited to edge High resolution is difficult Fast color printing requires one print head per color | Canon Bubblejet 1979 Endo et al GB patent 2,007,162 Xerox heater-in-pit 1990 Hawkins et al U.S. Pat. No. 4,899,181 Tone-jet |
| Surface ('roof shooter') | Ink flow is along the surface of the chip, and ink drops are ejected from the chip surface, normal to the plane of the chip. | No bulk silicon etching required Silicon can make an effective heat sink Mechanical strength | Maximum ink flow is severely restricted | Hewlett-Packard TIJ 1982 Vaught et al U.S. Pat. No. 4,490,728 IJ02, IJ11, IJ12, IJ20, IJ22 |
| Through chip, forward ('up shooter') | Ink flow is through the chip, and ink drops are ejected from the front surface of the chip. | High ink flow Suitable for pagewidth print heads High nozzle packing density therefore low manufacturing cost | Requires bulk silicon etching | Silverbrook, EP 0771 658 A2 and related patent applications IJ04, IJ17, IJ18, IJ24, IJ27–IJ45 |
| Through chip, reverse ('down shooter') | Ink flow is through the chip, and ink drops are ejected from the rear surface of the chip. | High ink flow Suitable for pagewidth print heads High nozzle packing density therefore low manufacturing cost | Requires wafer thinning Requires special handling during manufacture | IJ01, IJ03, IJ05, IJ06, IJ07, IJ08, IJ09, IJ10, IJ13, IJ14, IJ15, IJ16, IJ19, IJ21, IJ23, IJ25, IJ26 |

-continued

DROP EJECTION DIRECTION

| | Description | Advantages | Disadvantages | Examples |
|---|---|---|---|---|
| Through actuator | Ink flow is through the actuator, which is not fabricated as part of the same substrate as the drive transistors. | Suitable for piezoelectric print heads | Pagewidth print heads require several thousand connections to drive circuits Cannot be manufactured in standard CMOS fabs Complex assembly required | Epson Stylus Tektronix hot melt piezoelectric ink jets |

INK TYPE

| | Description | Advantages | Disadvantages | Examples |
|---|---|---|---|---|
| Aqueous, dye | Water based ink which typically contains: water, dye, surfactant, humectant, and biocide. Modern ink dyes have high water-fastness, light fastness | Environmentally friendly No odor | Slow drying Corrosive Bleeds on paper May strikethrough Cockles paper | Most existing ink jets All IJ series ink jets Silverbrook, EP 0771 658 A2 and related patent applications |
| Aqueous, pigment | Water based ink which typically contains: water, pigment, surfactant, humectant, and biocide. Pigments have an advantage in reduced bleed, wicking and strikethrough. | Environmentally friendly No odor Reduced bleed Reduced wicking Reduced strikethrough | Slow drying Corrosive Pigment may clog nozzles Pigment may clog actuator mechanisms Cockles paper | IJ02, IJ04, IJ21, IJ26, IJ27, IJ30 Silverbrook, EP 0771 658 A2 and related patent applications Piezoelectric ink-jets Thermal ink jets (with significant restrictions) |
| Methyl Ethyl Ketone (MEK) | MEK is a highly volatile solvent used for industrial printing on difficult surfaces such as aluminum cans. | Very fast drying Prints on various substrates such as metals and plastics | Odorous Flammable | All IJ series ink jets |
| Alcohol (ethanol, 2-butanol, and others) | Alcohol based inks can be used where the printer must operate at temperatures below the freezing point of water. An example of this is in-camera consumer photographic printing. | Fast drying Operates at sub-freezing temperatures Reduced paper cockle Low cost | Slight odor Flammable | All IJ series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | No drying time-ink instantly freezes on the print medium Almost any print medium can be used No paper cockle occurs No wicking occurs No bleed occurs No strikethrough occurs | High viscosity Printed ink typically has a 'waxy' feel Printed pages may 'block' Ink temperature may be above the curie point of permanent magnets Ink heaters consume power Long warm-up time | Tektronix hot melt piezoelectric ink jets 1989 Nowak U.S. Pat. No. 4,820,346 All IJ series ink jets |
| Oil | Oil based inks are extensively used in offset printing. They have advantages in improved characteristics on | High solubility medium for some dyes Does not cockle paper Does not wick | High viscosity: this is a significant limitation for use in ink jets, which usually require a low viscosity. Some | All IJ series ink jets |

-continued

INK TYPE

| | Description | Advantages | Disadvantages | Examples |
|---|---|---|---|---|
| | paper (especially no wicking or cockle). Oil soluble dies and pigments are required. | through paper | short chain and multi-branched oils have a sufficiently low viscosity. Slow drying | |
| Micro-emulsion | A microemulsion is a stable, self forming emulsion of oil, water, and surfactant. The characteristic drop size is less than 100 nm, and is determined by the preferred curvature of the surfactant. | Stops ink bleed High dye solubility Water, oil, and amphiphilic soluble dies can be used Can stabilize pigment suspensions | Viscosity higher than water Cost is slightly higher than water based ink High surfactant concentration required (around 5%) | All IJ series ink jets |

What is claimed is:

1. A method of manufacture of an ink jet printhead which includes a nozzle chamber having at least two fluid ejection apertures defined in a roof of the chamber; a moveable paddle vane located in a region of a first one of the fluid ejection apertures; an actuator mechanism attached to the moveable paddle vane and adapted to move the paddle vane in a first direction so as to cause the ejection of fluid drops out of the first fluid ejection aperture and to further move the paddle vane in a second, alternative direction so as to cause the ejection of fluid drops out of a second fluid ejection aperture, the method comprising the steps of:

(a) initially providing a silicon wafer having a circuitry wafer layer including electrical circuitry necessary for the operation of the actuator mechanism on demand;

(b) etching a trough in the wafer to provide for an ink supply channel through a portion of the wafer;

(c) creating the nozzle chamber, the actuator mechanism and the paddle vane within the nozzle chamber on the silicon wafer by means of depositing and etching a series of sacrificial layers to form a supporting structure for the nozzle chamber, the actuator mechanism and the paddle vane, in addition to depositing and suitably etching a series of materials for forming the nozzle chamber including a pair of fluid ejection apertures in a roof of the nozzle chamber, the actuator mechanism and the paddle vane;

(d) etching an ink inlet in the wafer, the inlet being in communication with the nozzle chamber via the ink supply channel extending through the wafer; and (e) etching away any remaining sacrificial layers so as to release the actuator mechanism and said paddle vane such that the paddle vane is displaceable relative to the fluid ejection apertures for effecting ink ejection from one of the apertures at a time on demand.

2. A method as claimed in claim 1 wherein step (c) comprises the steps of:

(i) depositing and etching a first series of sacrificial layers to form a first supporting structure;

(ii) depositing and etching a first non-conductive material layer to form a first structure including a portion of the nozzle chamber and a first portion of the actuator mechanism;

(iii) depositing and etching a first conductive material layer to form a lower heater structure of the actuator mechanism;

(iv) depositing and etching a second non-conductive material layer forming a central portion of the actuator mechanism, a portion of the nozzle wall and the paddle vane in addition to a supporting structure for an upper heater structure;

(v) depositing and etching a second conductive material layer to form an upper heater structure of the actuator mechanism;

(vi) depositing and etching a further, third non-conductive material layer so as to form the paddle vane, the nozzle chamber walls and a portion affixing one end of the actuator mechanism to the wafer;

(vii) depositing and etching a further sacrificial layer to form a further supporting structure for the nozzle chamber walls; and (viii) depositing and etching a further, fourth non-conductive material layer forming the nozzle chamber walls and roof in addition to the fluid ejection apertures.

3. A method as claimed in claim 2 wherein the first and second conductive material comprises substantially a copper nickel alloy.

4. A method as claimed in claim 2 wherein the non-conductive material comprises substantially silicon dioxide.

5. A method as claimed in claim 1 wherein the sacrificial layers comprise substantially glass and/or aluminum.

6. A method as claimed in claim 1 further including the step of depositing corrosion barriers over portions of said arrangement so as to reduce corrosion effects.

7. A method as claimed in claim 1 wherein said wafer comprises a double sided polished CMOS wafer.

8. A method as claimed in claim 1 wherein at least step (e) is also utilized to simultaneously separate said wafer into separate printheads.

* * * * *